(12) United States Patent
Du

(10) Patent No.: US 9,806,066 B2
(45) Date of Patent: Oct. 31, 2017

(54) SEMICONDUCTOR PACKAGE INCLUDING EXPOSED CONNECTING STUBS

(71) Applicant: Samsung Electronics Co., Ltd., Suwon-si, Gyeonggi-do (KR)

(72) Inventor: Maohua Du, Suzhou (CN)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/001,872

(22) Filed: Jan. 20, 2016

(65) Prior Publication Data

US 2016/0218091 A1    Jul. 28, 2016

(30) Foreign Application Priority Data

Jan. 23, 2015   (CN) .......................... 2015 1 0036267
Sep. 7, 2015    (KR) .......................... 10-2015-0126526

(51) Int. Cl.
*H01L 23/48* (2006.01)
*H01L 25/10* (2006.01)
(Continued)

(52) U.S. Cl.
CPC ...... *H01L 25/105* (2013.01); *H01L 23/49811* (2013.01); *H01L 24/00* (2013.01); *H01L 23/49827* (2013.01); *H01L 23/49838* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/48997* (2013.01); *H01L 2224/49109* (2013.01);
(Continued)

(58) Field of Classification Search
CPC ............ H01L 23/49816; H01L 23/481; H01L 23/5226; H01L 23/5389; H01L 2224/16225
USPC ....................................................... 257/774
See application file for complete search history.

(56) References Cited

U.S. PATENT DOCUMENTS

| 6,215,182 B1 | 4/2001 | Ozawa et al. |
| 7,129,576 B2 | 10/2006 | Humpston |
(Continued)

FOREIGN PATENT DOCUMENTS

| CN | 101083244 A | 12/2007 |
| CN | 102738094 A | 10/2012 |
(Continued)

OTHER PUBLICATIONS

Chinese Office Action issued on Dec. 21, 2016 for corresponding Chinese application No. 201510036267.0.

*Primary Examiner* — Trung Q Dang
(74) *Attorney, Agent, or Firm* — Harness, Dickey & Pierce, P.L.C.

(57) ABSTRACT

A semiconductor package includes a substrate comprising a chip area and a peripheral area, at least one semiconductor chip mounted on the chip area, a plurality of stubs respectively on a plurality of pads arranged in the peripheral area, and a molding unit configured to cover at least a partial area of the at least one semiconductor chip and at least a partial area of the plurality of stubs on the substrate while exposing an upper surface of at least one of the plurality of stubs to outside of the molding unit, wherein at least a partial area of the upper surface of at least one of the plurality of stubs is substantially flat.

18 Claims, 38 Drawing Sheets

(51) Int. Cl.
*H01L 23/498* (2006.01)
*H01L 23/00* (2006.01)

(52) U.S. Cl.
CPC .............. *H01L 2224/73265* (2013.01); *H01L 2225/1058* (2013.01); *H01L 2924/0002* (2013.01); *H01L 2924/15311* (2013.01); *H01L 2924/181* (2013.01)

(56) References Cited

U.S. PATENT DOCUMENTS

| | | | |
|---|---|---|---|
| 7,671,457 | B1 | 3/2010 | Hiner et al. |
| 7,737,565 | B2 | 6/2010 | Coffy |
| 7,741,154 | B2 | 6/2010 | Ha et al. |
| 8,012,797 | B2 | 9/2011 | Shen et al. |
| 8,071,470 | B2 | 12/2011 | Khor et al. |
| 8,093,697 | B2 | 1/2012 | Haba et al. |
| 8,129,221 | B2 | 3/2012 | Hwang et al. |
| 8,158,888 | B2 | 4/2012 | Shen et al. |
| 8,404,518 | B2 | 3/2013 | Do et al. |
| 8,482,111 | B2 | 7/2013 | Haba |
| 9,293,401 | B2 | 3/2016 | Yoon et al. |
| 2007/0108583 | A1 | 5/2007 | Shim et al. |
| 2007/0164457 | A1* | 7/2007 | Yamaguchi ......... H01L 23/5389 257/787 |
| 2012/0153499 | A1* | 6/2012 | Byun ................ H01L 23/49827 257/774 |
| 2012/0193783 | A1* | 8/2012 | Hong ................ H01L 23/49816 257/737 |
| 2012/0280386 | A1 | 11/2012 | Sato et al. |
| 2013/0105979 | A1 | 5/2013 | Yu et al. |
| 2013/0221522 | A1 | 8/2013 | Chen et al. |
| 2014/0084416 | A1* | 3/2014 | Kang ..................... H01L 23/50 257/532 |
| 2014/0312481 | A1* | 10/2014 | Choi ....................... H01L 25/50 257/686 |
| 2015/0091150 | A1* | 4/2015 | Lin .................. H01L 23/49811 257/686 |
| 2016/0141238 | A1 | 5/2016 | Yoon et al. |

FOREIGN PATENT DOCUMENTS

| | | |
|---|---|---|
| CN | 103109367 A | 5/2013 |
| CN | 103295925 A | 9/2013 |

* cited by examiner

SEMICONDUCTOR PACKAGE INCLUDING EXPOSED CONNECTING STUBS

CROSS-REFERENCE TO RELATED APPLICATION

This application claims the benefit of priority from Korean Patent Application No. 10-2015-0126526, filed on Sep. 7, 2015, in the Korean Intellectual Property Office, and Chinese Patent Application No. 201510036267.0, filed on Jan. 23, 2015, in the State Intellectual Property Office of the P.R.C., the disclosures of which are incorporated herein in their entireties by reference.

BACKGROUND

The inventive concepts relate to a semiconductor package, and/or to a method of manufacturing a package-on-package (PoP) including stubs.

A system-in-package (SIP) has been proposed for a highly integrated semiconductor package. The SIP has been largely developed and typically includes two types. One type is a multi-chip package (MCP) in which a plurality of semiconductor chips are stacked in a single semiconductor package, and the other type is a PoP in which semiconductor packages that are individually assembled, and where electrical testing of the PoP is completed are stacked in a vertical direction.

SUMMARY

The inventive concepts relate to a semiconductor package manufacturing method capable of reducing or substantially preventing electrical properties of a miniaturized semiconductor package from deteriorating, and maintaining reliability.

According to at least one example embodiment, there is provided a semiconductor package including a substrate including a chip area and a peripheral area, at least one semiconductor chip mounted on the chip area, a plurality of stubs respectively on a plurality of pads arranged in the peripheral area, and a molding unit configured to cover at least a partial area of the at least one semiconductor chip and at least a partial area of the plurality of stubs on the substrate while exposing an upper surface of each or one or more of the plurality of stubs to outside of the molding unit, and at least a partial area of the upper surface of each or one or more of the plurality of stubs may be flat. Each or one or more of the plurality of stubs may include a plurality of sub-stubs stacked in a first direction that is perpendicular to an upper surface of the substrate.

The plurality of sub-stubs may include a plurality of first sub-stubs formed on the plurality of pads, and a plurality of second sub-stubs formed on the plurality of first sub-stubs, where partial upper areas of the plurality of second sub-stubs may be exposed to the outside of the molding unit by a plurality of concave portions formed in the molding unit, and an upper surface of each or one or more of the plurality of second sub-stubs may be flat.

Widths of the plurality of concave portions in a second direction that is perpendicular to the first direction may be greater than widths of the plurality of stubs in the second direction. Depths of the plurality of concave portions in the first direction may be smaller than half a depth of the molding unit in the first direction. A length of each or one or more of the plurality of stubs in the first direction may be in a range from about 1 to about 100 μm.

The semiconductor package may further include a first bonding wire configured to connect the at least one semiconductor chip and the plurality of pads on the substrate, and a second bonding wire configured to connect the at least one semiconductor chip and the plurality of stubs, one end of the second bonding wire is connected to the at least one semiconductor chip, and the other end thereof is arranged between the plurality of sub-stubs and is connected to the plurality of stubs. Widths of the plurality of stubs in the second direction may be in a range from about 1 to about 150 μm.

An upper surface of the molding unit may be located at a higher level than a level of upper surfaces of the plurality of stubs, and the molding unit may include a plurality of concave portions that expose an upper surface of each or one or more of the plurality of stubs. Alternatively, an upper surface of the molding unit may be located at a same level as the level of the upper surfaces of the plurality of stubs According to another example embodiment, there is provided a semiconductor package including a first package, and a second package stacked on the first package, the first package including a first substrate, at least one first semiconductor chip mounted on the first substrate, a plurality of stubs formed on the first substrate, and a first molding unit configured to cover at least a partial area of the at least one first semiconductor chip and at least a partial area of the plurality of stubs on the first substrate. The second package may include a second substrate, at least one second semiconductor chip mounted on the second substrate, a second molding unit configured to cover at least a partial area of the at least one second semiconductor chip on the second substrate, and a plurality of external connection members formed on a lower surface of the second substrate, where the plurality of external connection members may be respectively connected to the plurality of stubs.

An upper surface of the first molding unit may be located at a higher level than a level of upper surfaces of the plurality of stubs, the first molding unit may include a plurality of concave portions that expose an upper surface of each or one or more of the plurality of stubs, and partial lower areas of the plurality of external connection members may be located in the plurality of concave portions.

An upper surface of the first molding unit, upper surfaces of the plurality of stubs, and lower surfaces of the plurality of external connection members may be located at a same level, and the upper surfaces of the plurality of stubs and the lower surfaces of the plurality of external connection members may be in contact with each other. Each or one or more of the plurality of stubs may include a plurality of sub-stubs stacked in a first direction that is perpendicular to an upper surface of the substrate, and each or one or more of the plurality of sub-stubs has a pillar shape having a middle width greater than a width of upper and lower ends in the first direction.

The plurality of external connection members may be arranged to overlap with the plurality of stubs with respect to a plan view.

In example embodiments, a semiconductor package includes at least one semiconductor chip and a plurality of stubs on a substrate, and a molding unit covering the at least one semiconductor chip and the plurality of stubs, the molding unit exposing a surface of at least one of the plurality of stubs that is opposite to the substrate, the plurality of stubs being configured to connect the substrate to an external device.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
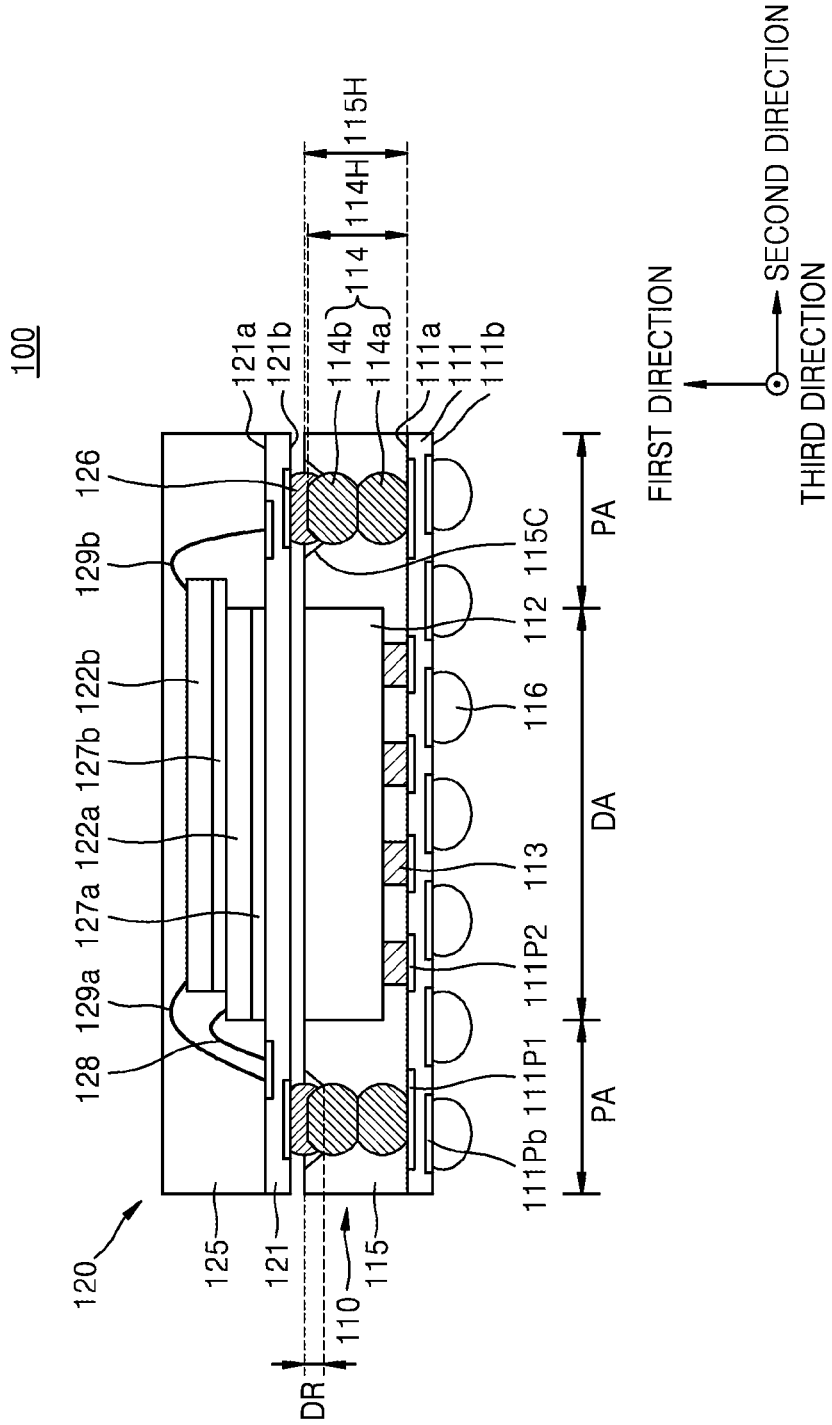
FIG. 1A is a cross-sectional view showing a semiconductor package, according to an example embodiment.

The inventive concepts will now be described more fully with reference to the accompanying drawings, in which example embodiments of the inventive concepts are shown. Like reference numerals denote like elements throughout the specification. Redundant descriptions of the like elements are omitted.

The inventive concepts may, however, be embodied in many different forms, and should not be construed as being limited to the embodiments set forth herein; rather, these embodiments are provided so that this disclosure will be thorough and complete, and will fully convey the inventive concepts to those skilled in the art.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", "third" etc. may be used herein to describe various elements, parts, regions, layers and/or sections, these elements, parts, regions, layers and/or sections should not be limited by these terms. These terms are only used to distinguish one element, part, region, layer or section from another element, part, region, layer or section. Thus, a first element, part, region, layer or section discussed below could be termed a second element, part, region, layer or section without departing from the teachings herein. For example, a first component may be referred to as a second component, or a second component may be referred to as a first component.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless defined differently, all terms used in the description including technical and scientific terms have the same meanings as generally understood by those skilled in the art. Terms commonly used and defined in dictionaries should be construed as having the same meanings as in the associated technical context of the inventive concepts, and unless defined apparently in the description, these terms are not ideally or excessively construed as having formal meanings. As used herein, expressions such as "at least one of," when preceding a list of elements, modify the entire list of elements and do not modify the individual elements of the list.

When a certain embodiment may be implemented differently, a specific process order may be performed differently from the described order. For example, two consecutively described processes may be performed substantially at the same time or performed in an order opposite to the described order.

Variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1B:
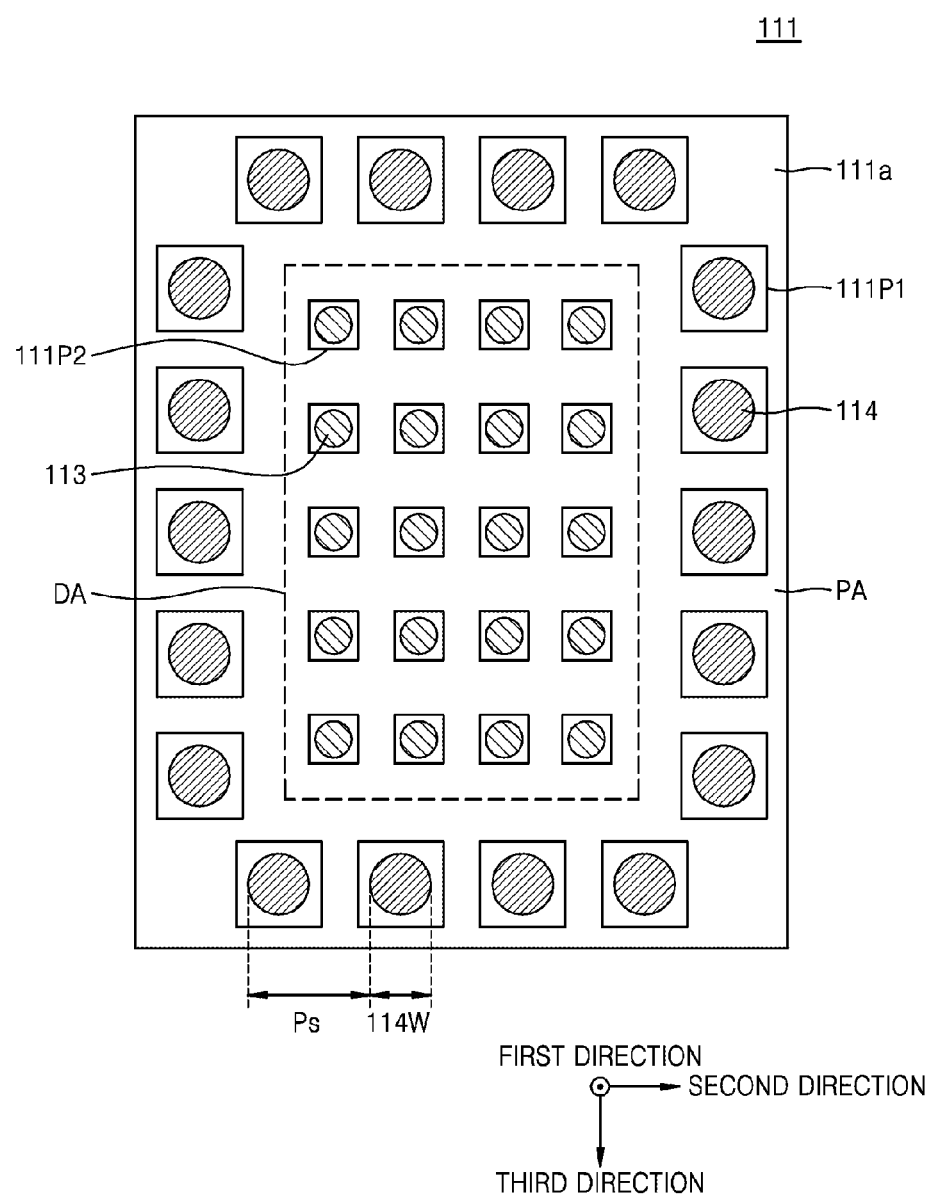
FIG. 1B is a plan view showing a first package that may be included in the semiconductor package shown in FIG. 1A.

FIG. 1A is a cross-sectional view showing a semiconductor package 100 according to an example embodiment. FIG. 1B is a plan view showing a first package 110 that may be included in the semiconductor package 100 shown in FIG. 1A.

Referring to FIGS. 1A and 1B, the semiconductor package 100 may include the first package 110 and a second package 120. The semiconductor package 100 may be or include a package-on-package (POP) in which the second package 120 is stacked on the first package 110.

The first package 110 may include a first substrate 111, a first semiconductor chip 112, chip connection members 113, a first molding unit 115, stubs 114, and first external connection members 116.

The first substrate 111 may be formed based on an active wafer or an interposer substrate. The first substrate 111 may be or include, for example, a printed circuit board (PCB).

The first substrate 111 may have a flat panel structure including an upper surface 111a and a lower surface 111b. A chip area DA and a peripheral area PA may be defined in the upper surface 111a of the first substrate 111. In some example embodiments, the chip area DA may be formed in a center portion of the first substrate 111, and the peripheral area PA may be formed to surround the chip area DA as shown in FIG. 1B but is not limited thereto. For example, the peripheral area PA may be formed only in at least one side edge of the chip area DA unlike as shown in FIG. 1B.

The first substrate 111 may include first upper pads 111P1 formed in the peripheral area PA of the upper surface 111a, second upper pads 111P2 formed in the chip area DA of the upper surface 111a, and lower pads 111Pb formed in the lower surface 111b. The first substrate 111 may include a multilayer structure in which wire patterns (not shown) are formed in the first substrate 111. The wire patterns may be used to, or configured to, electrically connect the first upper pads 111P1 and the second upper pads 111P2 to the lower pads 111Pb.

The wire patterns, the lower pads 111Pb, the first upper pads 111P1, and the second upper pads 111P2 may be formed of or include, for example, aluminum or a copper foil. In some example embodiments, surfaces of the wire patterns, the lower pads 111Pb, the first upper pads 111P1, and the second upper pads 111P2 may be plated with tin (Sb), gold (Au), nickel (Ni), or lead (Pb), etc.

Although not shown, the first substrate 111 may further include a protection layer (not shown) that exposes only the lower pads 111Pb, the first upper pads 111P1, and the second upper pads 111P2, and that covers remaining areas. A material of the protection layer may use or include a photo solder resist which can be patterned by photo lithography. The protection layer may be formed as or include a solder mask define (SMD) type that at least partially exposes the first upper pads 111P1 and the second upper pads 111P2 and a non-solder mask define (NSMD) type that wholly exposes the first upper pads 111P1 and the second upper pads 111P2.

The first substrate 111 may be formed of or include silicon, glass, ceramics, or plastics, etc. For example, the first substrate 111 may include resin or photosensitive liquid dielectrics, photosensitive dry-film dielectrics, polyimide flexible film thermally cured dry films, thermally cured liquid dielectrics, resin coated copper (RCC) foil, thermoplastic resin, flexible resin, etc.

The first semiconductor chip 112 may be mounted on the chip area DA of the upper surface 111a.

The first semiconductor chip 112 may be or include a semiconductor chip that performs various functions such as a memory device, a logic device (for example, a microprocessor, an analogue device, or a digital signal processor), and a system-on-chip, etc. The memory device may include, for example, DRAM, SRAM, flash memory, EEPROM, PRAM, MRAM, or RRAM, etc. Although not specifically shown, the first semiconductor chip 112 may be or include a multi-chip having a structure in which a plurality of semiconductor chips are stacked. For example, the plurality of semiconductor chips may be or include the same type of memory devices. Alternatively, a part of the plurality of semiconductor chips may be or include memory devices, and another part thereof may be or include micro-controllers.

The first semiconductor chip 112 may be mounted on the upper surface 111a of the first substrate 111 in a flip chip bonding manner. In this case, the first semiconductor chip 112 may have an active surface in which chip pads (not shown) are formed and the active surface faces the first substrate 111, and the first semiconductor chip 112 may be coupled to the first substrate 111 through the chip connection members 113. The chip connection members 113 may be or include, for example, conductive bumps.

The stubs 114 may be formed in the upper surface 111a of the first substrate 111, in particular, in the first upper pads 111P1 formed in the peripheral area PA, and may electrically connect the first substrate 111 of the first package 110 and the second package 120.

The stubs 114 may have a first pitch Ps in a second direction (or a third direction) and may be spaced apart from each other. The first pitch Ps may be adjusted according to a width of the stubs 114. As an example, the first pitch Ps may be in the range from about 1.5 times to about 2.5 times a width 114W of the stubs 114 in the second direction (or the third direction). The width 114W of the stubs 114 may be in the range from about 1 to about 150 μm, and the first pitch Ps may be in the range from about 2 to about 300 μm.

In some example embodiments, each or one or more of the stubs 114 may include one or more sub-stubs. For example, each or one or more of the stubs 114 may include a first sub-stub 114a and a second sub-stub 114b that are stacked, for example sequentially stacked, on the first upper pad 111P1 as shown in FIG. 1A.

The first and second sub-stubs 114a and 114b will be described in detail with reference to FIG. 6B below.

Each or one or more of the first and second sub-stubs 114a and 114b may have a pillar shape. In more detail, each or one or more of the first and second sub-stubs 114a and 114b may have the pillar shape including a middle width Wmid (see FIG. 6B) that is greater than a width Wend (see FIG. 6B) of the upper and lower ends.

In some example embodiment, a length 114Hsa of the first sub-stub 114a and a length 114Hsb of the second sub-stub 114b may be substantially the same (see FIG. 6C) in a first direction. In some other example embodiment, the length 114Hsa of the first sub-stub 114a and the length 114Hsb of the second sub-stub 114b may be different. The length 114Hsa of the first sub-stub 114a and the length 114Hsb of the second sub-stub 114b in the first direction may be, for example, in the range from about 1 to about 100 μm.

Each or one or more of the first and second sub-stubs 114a and 114b may include at least one of gold (Au), silver (Ag), copper (Cu), palladium (Pd), and an alloy thereof, but is not limited thereto.

The stubs 114 of the example embodiment may be formed using the wire bonding process, thereby simplifying a process of manufacturing the semiconductor package 100 and also reducing process cost. This will be described in detail with reference to FIGS. 7A through 8C later.

The first molding unit 115 may be formed on the first substrate 111 to cover a side wall of the first semiconductor chip 112 and at least a part of each or one or more of the stubs 114, and protect the first semiconductor chip 112 and the stubs 114. The first molding unit 115 may be formed of, for example, a silicon based material, a thermosetting material, a thermoplastic material, a UV processed material, etc.

Meanwhile, when the first semiconductor chip 112 is mounted on the first substrate 111 in the flip-chip bonding manner according to the example embodiment, space between the first semiconductor chip 112 and the first substrate 111 may be filled with the first molding unit 115 through a molded under fill (MUF) process but is not limited thereto. The space between the first semiconductor chip 112 and the first substrate 111 may not be filled with the first molding unit 115 and may be filled with a separate under fill (not shown).

The first molding unit 115 of FIG. 1A is illustrated to cover only the side wall of the first semiconductor chip 112 but is not limited thereto. For example, the first molding unit 115 may be formed to cover not only the side wall of the first semiconductor chip 112 but also an upper surface thereof.

The first molding unit 115 may include a plurality of concave portion 115C that expose partial upper areas of the stubs 114. The concave portions 115C may extend from the upper surface of the first molding unit 115 to an interface between inclined surfaces of the concave portions 115C and the stubs 114.

A width 115W (see FIG. 6E) of the concave portions 115C in the second direction at substantially the same level as the upper surface of the first molding unit 115 may be greater than the width 114W (see FIG. 6E) of the stubs 114 in the second direction.

In some example embodiments, a depth DR of the concave portions 115C in the first direction may be equal to or less than half a length 115H of the first molding unit 115 in the first direction. In more detail, the depth DR of the concave portions 115C in the first direction may be from about 0.1 times to about 0.5 times the length 115H of the first molding unit 115 in the first direction. The depth DR of the concave portions 115C in the first direction may be, for example, in the range from about 1 μm to about 50 μm.

In some example embodiments, the first molding unit 115 may be formed to cover an entire area of the first sub-stub 114a and a partial lower area of the second sub-stub 114b, and expose a partial upper area of the second sub-stub 114a by the concave portions 115C. The partial upper area of the second sub-stub 114a exposed by the concave portions 115C may be connected to the second external connection members 126 of the second package 120 that will be described later.

In some example embodiments, the length 115H of the first molding unit 115 in the first direction may be greater than a length 114H of the stubs 114 in the first direction. In more detail, the length 114H of the stubs 114 in the first direction may be in the range from about 80% to about 99% of the length 115H of the first molding unit 115 in the first direction. In this regard, a difference 115H-114H between the length 115H of the first molding unit 115 in the first direction and the length 114H of the stubs 114 in the first direction may be in the ranged from about 1 μm to about 75 μm.

The first external connection members 116 may be formed on the lower pads 111Pb located on the lower surface 111b of the first substrate 111 and connect the semiconductor package 100 to an external device (not shown). The first external connection members 116 may be or include, for example, solder balls.

The second package 120 may include a second substrate 121, second semiconductor chips 122a and 122b, bonding wires 128, 129a, and 129b, a second molding unit 125, and second external connection members 126.

The second substrate 121 may be or include a PCB having a flat panel structure including an upper surface 121a and a lower surface 121b. The second substrate 121 may be formed of or include silicon, glass, ceramics, or plastics, etc. similarly to the first substrate 111 but is not limited thereto.

The second semiconductor chips 122a and 122b may be stacked, for example sequentially stacked on the second substrate 121. In more detail, the second semiconductor chip 122a may be attached onto the second substrate 121 through an adhesive member 127a, and the second semiconductor chip 122b may be attached onto the second semiconductor chip 122a through an adhesive member 127b. The adhesive members 127a and 127b may be or include one of, for example, a non-conductive film (NCF), an anisotropic conductive film (ACF), a UV film, an instantaneous adhesive, a thermosetting adhesive, a laser cure type adhesive, an ultrasound cure type adhesive, and a non-conductive paste (NCP).

The bonding wires 128, 129a, and 129b may be used to connect the second semiconductor chips 122a and 122b to the second substrate 121. In more detail, the second semiconductor chip 122a may be connected to the second substrate 121 by using the bonding wire 128, and the second semiconductor chip 122b may be connected to the second substrate 121 by using the bonding wires 129a and 129b.

The second semiconductor chips 122a and 122b may be mounted on the second substrate 121 through wire bonding in the example embodiment but are not limited thereto. For example, the second semiconductor chips 122a and 122b may be mounted through flip-chip bonding.

In some example embodiments, the second semiconductor chips 122a and 122b may be or include the same type of memory devices. In some other example embodiments, one of the second semiconductor chips 122a and 122b may be or include a memory device, and the other one thereof may be or include a micro-controller.

Meanwhile, the second package 120 is illustrated to include the two semiconductor chips 122a and 122b in the example embodiment but is not limited thereto. For example, the second package 120 may include only one semiconductor chip or three or more semiconductor chips.

The second molding unit 125 may be formed on the second substrate 121 to cover and protect the second semiconductor chips 122a and 122b. The second molding unit 125 may be formed of or include, for example, a silicon based material, a thermosetting material, a thermoplastic material, a UV processed material, etc.

The second external connection members 126 may be formed on lower pads located on the lower surface 121b of the second substrate 121 and connect the second package 120 to the first package 110. The second external connection members 126 may be in contact with partial upper areas of the stubs 114 of the first package 110. In this regard, partial lower areas of the second external connection members 126 may be located in the concave portions 115C of the first molding unit 115.

Meanwhile, the second external connection members 126 are illustrated to be spaced apart from side walls of the concave portions 115C in the example embodiment but are not limited thereto. That is, the second external connection members 126 may be in contact with the side walls of the concave portions 115C. In this regard, the concave portions 115C may be substantially filled with the second external connection members 126.

Furthermore, although the second external connection members 126 may be reflowed and coupled to the second sub-stub 114b in the example embodiment, the second sub-stub 114 may be reflowed and coupled to the second external connection members 126. This will be described in detail with reference to FIG. 6M later.

The second external connection members 126 may be disposed to overlap with the stubs 114 with respect to a plan view. That is, a layout structure of the second external connection members 126 as seen in a plan view may be substantially the same as or similar to a layout structure of the stubs 114 described with reference to FIG. 1B.

The second external connection members 126 may have substantially the same pitch as the pitch of the stubs 114 and may be spaced apart from each other. For example, the second external connection members 126 may have a pitch in the range from about 2 μm to about 300 μm and may be spaced apart from each other.

The second external connection members 126 may be formed by reflowing, for example, solder balls, which will be described in detail with reference to FIG. 10N later.

The semiconductor package 100 according to the example embodiment may include the stubs 114 between the first upper pads 111P1 of the first package 110 and the second external connection members 126 of the second package 120, thereby reducing sizes of the second external connection members 126. Accordingly, even when the second external connection members 126 are spaced apart to have a fine pitch for high integration, a possibility of short circuit due to deformation, contamination, or misalignment of the second external connection members 126 may be reduced.

Furthermore, the stubs 114 may be formed using the wire bonding process, thereby simplifying the process of manufacturing the semiconductor package 100 and simultaneously reducing the process cost.

In addition, the concave portions 115C formed in the first molding unit 115 of the first package 110 may be a barrier during a reflow process for forming the second external connection members 126. That is, the second external connection members 126 may have fluidity during the reflow process, thereby reducing the possibility of short circuit between the adjacent second external connection members 126.

Figure 2:
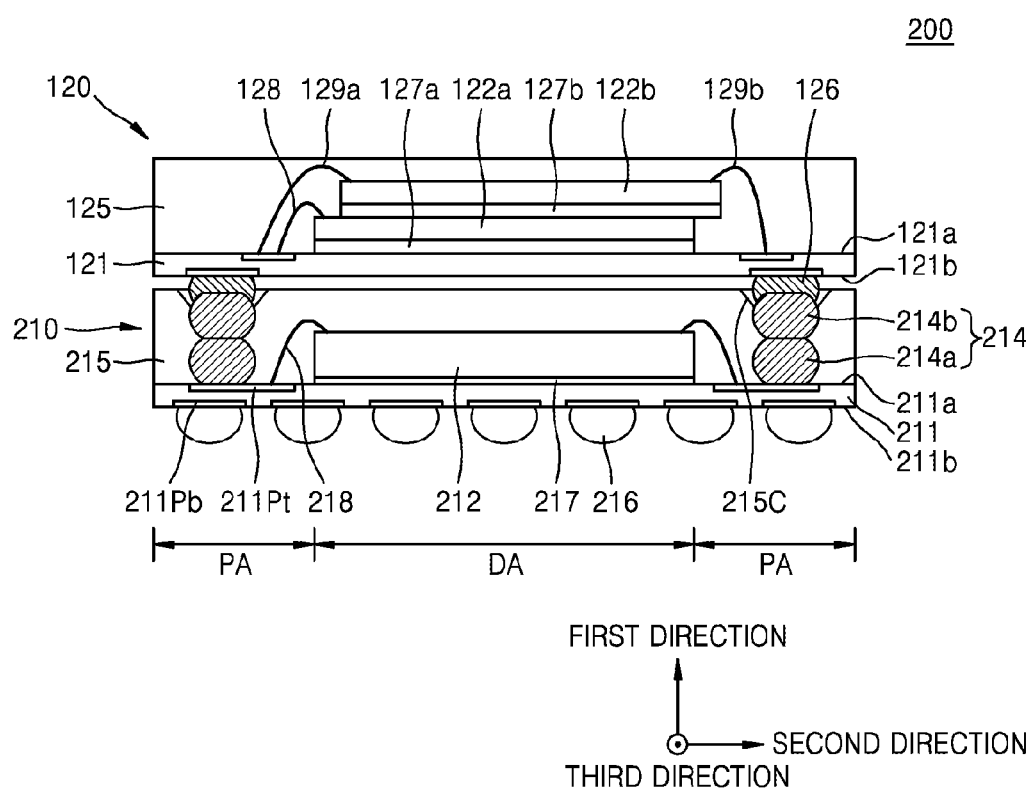
FIG. 2 is a cross-sectional view showing a semiconductor package, according to another example embodiment.

FIG. 2 is a cross-sectional view showing a semiconductor package 200 according to another example embodiment. The same reference numerals refer to the same elements between FIG. 2 and FIGS. 1A and 1B, and thus redundant descriptions thereof will be omitted for convenience of description.

The semiconductor package 200 of FIG. 2 has a similar structure to the structure of the semiconductor package 100 described with reference to FIGS. 1A and 1B, except that a first semiconductor chip 212 of the semiconductor package 200 is electrically connected to a first substrate 211 through bonding wire.

Referring to FIG. 2, the semiconductor package 200 may include a first package 210 and the second package 120. The semiconductor package 200 may be or include a package-on-package (POP) in which the second package 120 is stacked on the first package 210.

The first package 210 may include the first substrate 211, a first semiconductor chip 212, the chip connection members 218, a first molding unit 215, stubs 214, and first external connection members 216.

The first substrate 211 may include lower pads 211Pb formed in a lower surface 211b and upper pads 211Pt formed in an upper surface 211a. The first substrate 211 may include a multilayer structure in which wire patterns (not shown) are formed in the first substrate 211. The wire patterns may electrically connect the upper pads 211Pt and the lower pads 211Pb.

Although not shown, the first substrate 211 may further include a protection layer (not shown) that exposes only the lower pads 211Pb and the upper pads 211Pt and covers remaining areas.

The first substrate 211 may be formed of or include silicon, glass, ceramics, or plastics, etc. but is not limited thereto.

The first semiconductor chip 212 may be mounted on the upper surface 211a of the first substrate 211. The first semiconductor chip 212 may be attached onto the first substrate 211 through an adhesive member 217. The adhesive member 217 may be or include one of, for example, an NCF, an ACF, an UV film, an instantaneous adhesive, a thermosetting adhesive, a laser cure type adhesive, an ultrasound cure type adhesive, and an NCP.

The bonding wires 128, 129a, and 129b may connect the second semiconductor chips 122a and 122b to the second substrate 121. In more detail, the second semiconductor chip 122a may be connected to the second substrate 121 by using the bonding wire 128, and the second semiconductor chip 122b may be connected to the second substrate 121 by using the bonding wires 129a and 129b.

A bonding wire 218 may connect the first semiconductor chip 212 to the first substrate 211. In more detail, one end of the bonding wire 218 may be connected to the upper pads 211Pt located on the upper surface 211a of the first substrate 211 and another end thereof facing the one end may be connected to chip pads (not shown) located on an upper surface of the first semiconductor chip 212.

The first package 210 is illustrated to include only one semiconductor chip 212 in the example embodiment but is not limited thereto. For example, the first package 210 may include two or more semiconductor chips.

The stubs 214 may be formed in the upper pads 211Pt formed in the upper surface 211a of the first substrate 211 and may electrically connect the first package 210 and the second package 120.

In some example embodiments, each or one or more of the stubs 214 may include one or more sub-stubs, similarly to the stubs 114 described with reference to FIGS. 1A and 1B above. For example, each or one or more of the stubs 214 may include a first stub 214a and a second sub-stub 214b that are stacked, for example sequentially stacked, on the upper pads 211Pt as shown in FIG. 2. Each or one or more of the first and second sub-stubs 214a and 214b may have a pillar shape. Each or one or more of the first and second sub-stubs 214a and 214b may include at least one of gold (Au), silver (Ag), copper (Cu), palladium (Pd), and an alloy thereof, but is not limited thereto.

The stubs 214 of the example embodiment may be formed using a wire bonding process, thereby simplifying a process of manufacturing the semiconductor package 200 and reducing process cost.

The first molding unit 215 may be formed on the first substrate 211 to cover at least a partial area of each or one or more of the stubs 214, the first semiconductor chip 212, and the bonding wire 218 and protect them. The first molding unit 215 may be formed of, for example, a silicon based material, a thermosetting material, a thermoplastic material, a UV processed material, etc.

The first molding unit 215 may include a plurality of concave portions 215C that partially expose upper areas of the stubs 214. The concave portions 215C may have a structure that is substantially the same as or similar to a structure of the concave portions 115C described with reference to FIG. 1A above.

The first external connection members 216 may be formed on the lower pads 211Pb located on the lower surface 211b of the first substrate 211 and connect the semiconductor package 200 to an external device (not shown). The first external connection members 216 may have a structure that is substantially the same as or similar to a structure of the first external connection members 116 described with reference to FIG. 1A above.

The second package 120 may be stacked on the first package 210 through the second external connection members 126. The second package 120 is described in detail with reference to FIGS. 1A and 1B, and thus a description thereof will be omitted.

Figure 3:
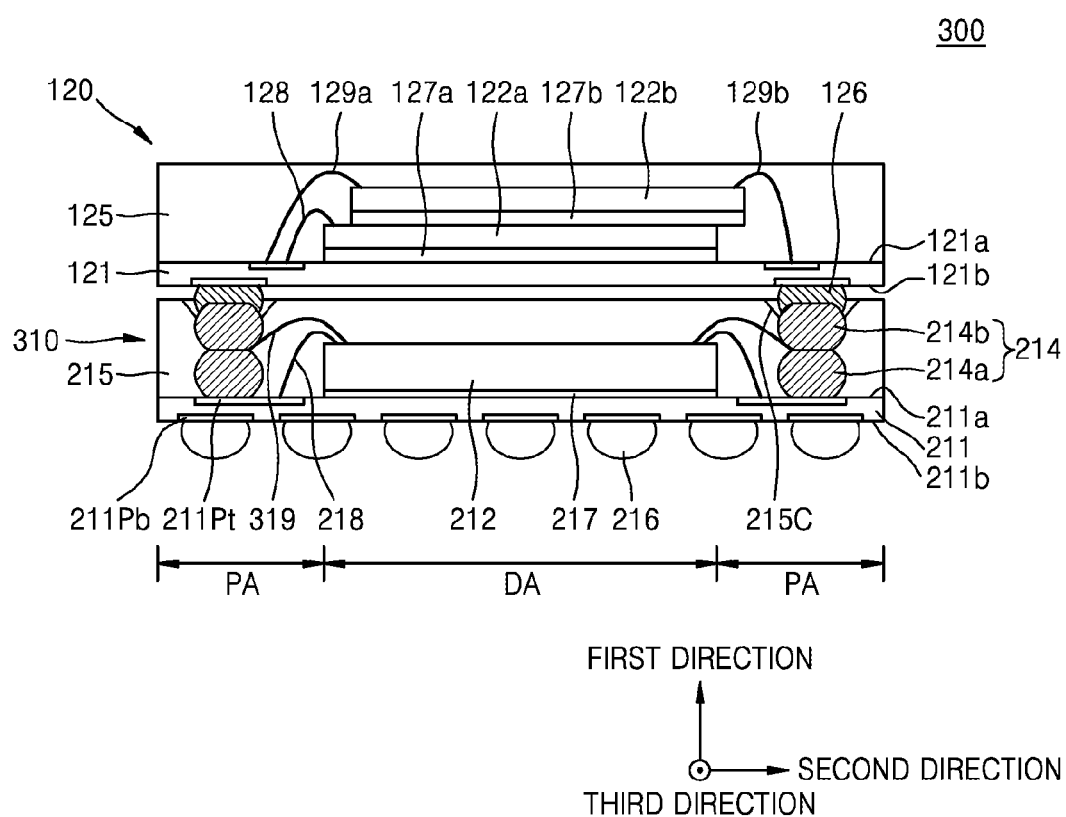
FIG. 3 is a cross-sectional view showing a semiconductor package, according to another example embodiment.

FIG. 3 is a cross-sectional view showing a semiconductor package 300 according to another example embodiment. The same reference numerals in FIG. 3 and FIGS. 1A through 2 refer to the same elements, and thus redundant descriptions thereof will be omitted for convenience of description.

The semiconductor package 300 of FIG. 3 has a similar structure to the structure of the semiconductor package 200 described with reference to FIG. 2, except that a first package 310 further includes an additional bonding wire 319.

Bonding wires 218 and 319 of the first package 310 may connect the first semiconductor chip 212 to the first substrate 211 or the stubs 214.

In particular, the first package 310 of the example embodiment may include the bonding wire 319 having one end connected to chip pads (not shown) located on an upper surface of the first semiconductor chip 212, and the other end connected to the stubs 214.

In more detail, the other end of the bonding wire 319 may be connected to a location between a first sub stub 214a and a second sub stub 214b.

A method of manufacturing the semiconductor package 300 will be described in detail with reference to FIGS. 13A through 13E below.

Figure 4:
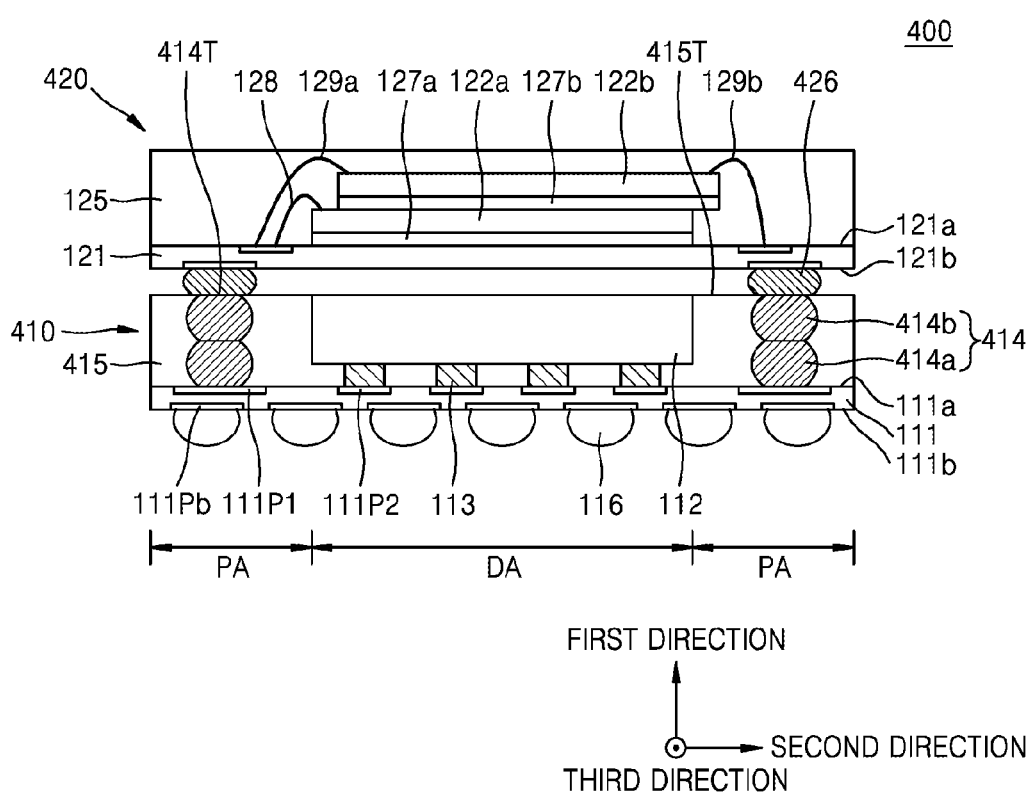
FIG. 4 is a cross-sectional view showing a semiconductor package, according to another example embodiment.

FIG. 4 is a cross-sectional view showing a semiconductor package 400 according to another example embodiment. The same reference numerals in FIG. 4 and FIGS. 1A through 3 refer to the same elements, and thus redundant descriptions thereof will be omitted for convenience of description.

The semiconductor package 400 of FIG. 4 has a similar structure to the structure of the semiconductor package 100 described with reference to FIGS. 1A and 1B, except for a first molding unit 415 of a first package 410, and a second external connection members 426 of a second package 420.

Referring to FIG. 4, the semiconductor package 400 may include the first package 410 and the second package 420. The semiconductor package 400 may be or include a package-on-package (POP) in which the second package 420 is stacked on the first package 410.

The first package 410 may include the first substrate 111, the first semiconductor chip 112, the chip connection members 113, stubs 414, a first molding unit 415, and the first external connection members 116.

The stubs 414 may be formed in the upper pads 111P1 formed in the upper surface 111a of the first substrate 111 and may electrically connect the first package 410 and the second package 420. The first molding unit 415 may protect the first semiconductor chip 112 and the stubs 414.

The stubs 414 and the first molding unit 415 may respectively have similar structures and functions to the structures and functions of the stubs 114 and the first molding unit 115 described with reference to FIG. 1A above. Unlike the stubs 114 and the first molding unit 115 of FIG. 1A, upper surfaces 414T of the stubs 414 of the example embodiment may be formed at substantially the same level as the level of an upper surface 415T of the first molding unit 415. That is, the first molding unit 415 may be formed to expose the upper surfaces 414T of the stubs 414 while covering side surfaces of the stubs 414.

The second package 420 may be stacked on the first package 410 through second external connection members 426. In this regard, the second external connection members 426 may be in contact with the exposed upper surfaces 414T of the stubs 414.

Figure 5:
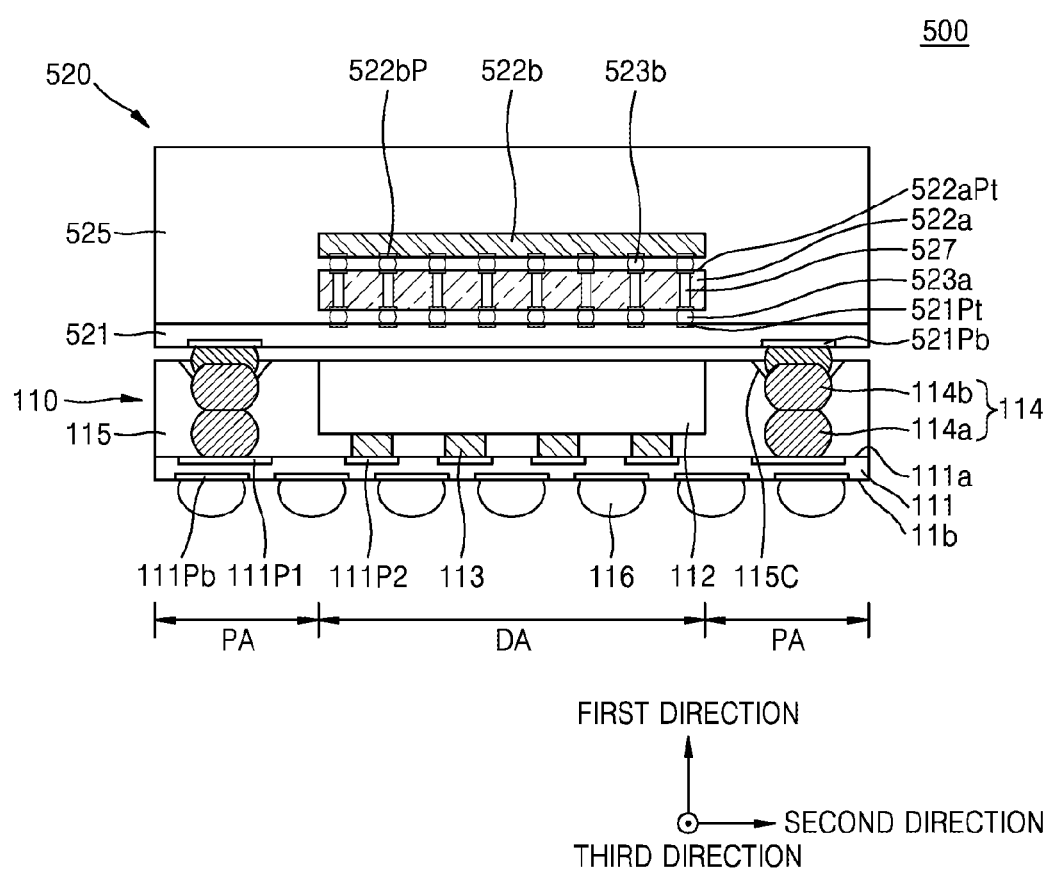
FIG. 5 is a cross-sectional view showing a semiconductor package, according to another example embodiment.

FIG. 5 is a cross-sectional view showing a semiconductor package 500 according to another example embodiment. The same reference numerals in FIG. 5 and FIGS. 1A through 4 refer to the same elements, and thus redundant descriptions thereof will be omitted for convenience of description.

The semiconductor package 500 of FIG. 5 has a similar structure to the structure of the semiconductor package 100 described with reference to FIGS. 1A and 1B, except for a stack structure of second semiconductor chips 522a and 522b.

Referring to FIG. 5, the semiconductor package 500 may include the first package 110 and a second package 520. The semiconductor package 500 may be or include a package-on-package (POP) in which the second package 520 is stacked on the first package 110.

The first package 110 is described in detail with reference to FIGS. 1A and 1B, and thus the second package 520 will now be described.

The second package 520 may include the second semiconductor chips 522a and 522b stacked on a second substrate 521.

The second semiconductor chips 522a and 522b may be mounted on the second substrate 521 in a flip-chip manner. Accordingly, the second semiconductor chips 522a and 522b may be stacked such that an active surface in which chip pads are formed may face the second substrate 521.

In more detail, lower chip pads 522aPb may be formed on the active surface of the second semiconductor chip 522a and may be connected to upper pads 521Pt of the second substrate 521 through chip connection members 523a, for example, bumps. Meanwhile, a through silicon via (TSV) 527 may be formed in the second semiconductor chip 522a and may electrically connect upper chip pads 522aPt and the lower chip pads 522aPb of the second semiconductor chip 522a.

Chip pads 522bP may be formed on the active surface of the second semiconductor chip 522b and may connect the upper chip pads 522aPt of the second semiconductor chip 522a through chip connection members 523b, for example, bumps.

In conclusion, the chip pads 522bP of the second semiconductor chip 522b may be electrically connected to the upper pads 521Pt of the second substrate 521 through the chip connection members 523b, the TSV 527, and the chip connection members 523a.

Although two semiconductor chips are stacked on the second substrate 521 in the semiconductor package 500 of the example embodiment, the number of stacked semiconductor chips is not limited thereto. For example, three or more semiconductor chips may be stacked. However, a TSV may be formed in semiconductor chips below an uppermost semiconductor chip in order to stack the semiconductor chips in a flip-chip manner, but is not formed in the uppermost semiconductor chip.

FIGS. 6A through 6M are cross-sectional views sequentially showing a method of manufacturing a semiconductor device, according to an example embodiment. The same reference numerals refer to the same elements between FIGS. 6A through 6M and FIGS. 1A through 5, and thus redundant descriptions thereof will be omitted for convenience of description.

Figure 6A:
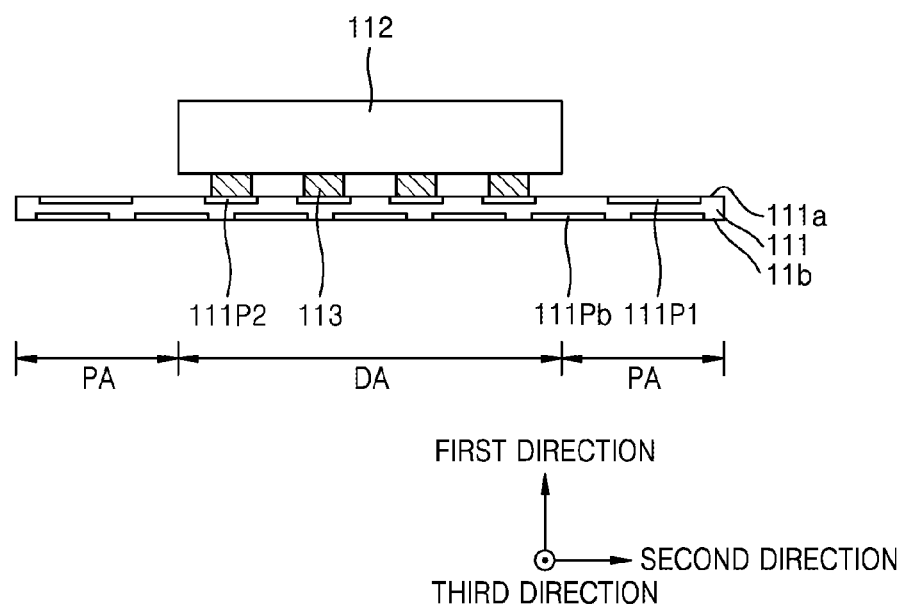
FIGS. 6A through 6M are cross-sectional views sequentially showing a method of manufacturing a semiconductor device, according to an example embodiment.

Referring to FIG. 6A, the first substrate 111 having a flat panel structure including the upper surface 111a and the lower surface 111b may be prepared. The first semiconductor chip 112 may be mounted on the upper surface 111a of the first substrate 111.

The chip area DA and the peripheral area PA may be defined in the upper surface 111a of the first substrate 111. The chip area DA may be an area on which the first semiconductor chip 112 may be mounted. The first substrate 111 may include the lower pads 111Pb formed in the lower surface 111b, the second upper pads 111P2 formed in the chip area DA of the upper surface 111a, and the first upper pads 111P1 formed in the peripheral area PA of the upper surface 111a.

The first semiconductor chip 112 may have an active surface in which chip pads (not shown) are formed and the active surface faces the first substrate 111, and the first semiconductor chip 112 may be connected to the second upper pads 111P2 of the first substrate 111 through the chip connection members 113.

Figure 6B:
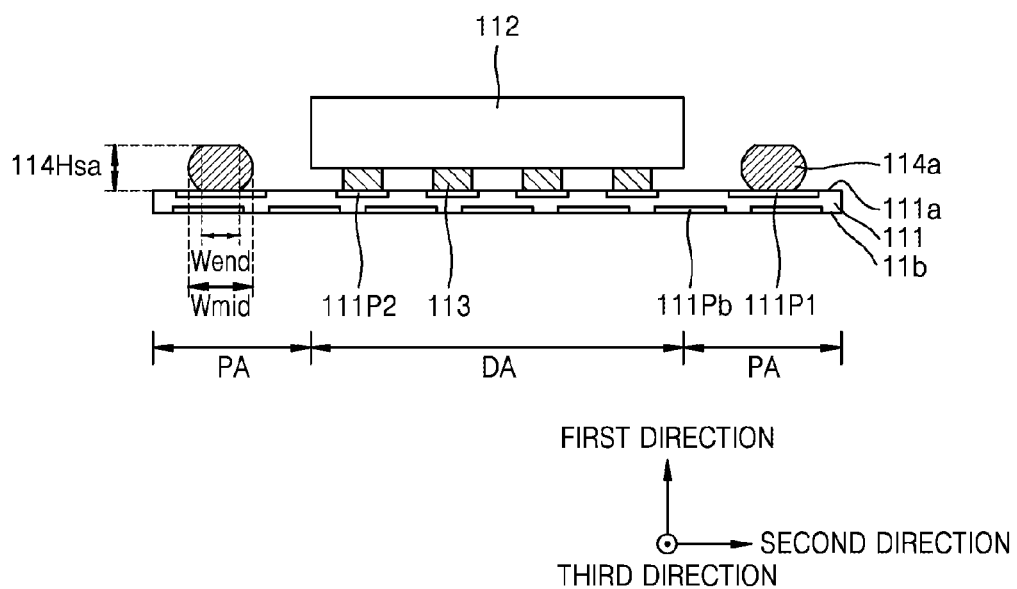

Referring to FIG. 6B, the first sub-stubs 114a may be formed in the upper surface 111a of the first substrate 111, in particular, in the first upper pads 111P1 formed in the peripheral area PA.

The first sub-stubs 114a may each have a pillar shape. In more detail, the first sub-stubs 114a may each have the pillar shape including the middle width Wmid greater than the width Wend of upper and lower ends.

In some example embodiment, the length 114Hsa of the first sub-stubs 114a in a first direction may be, for example, in the range from about 1 to about 100 µm, and the middle width Wmid thereof may be in the range from about 1 to about 150 µm.

The first sub-stubs 114a may be formed using a wire bonding process, which will be described in detail with reference to FIGS. 7A through 8C later.

Figure 6C:
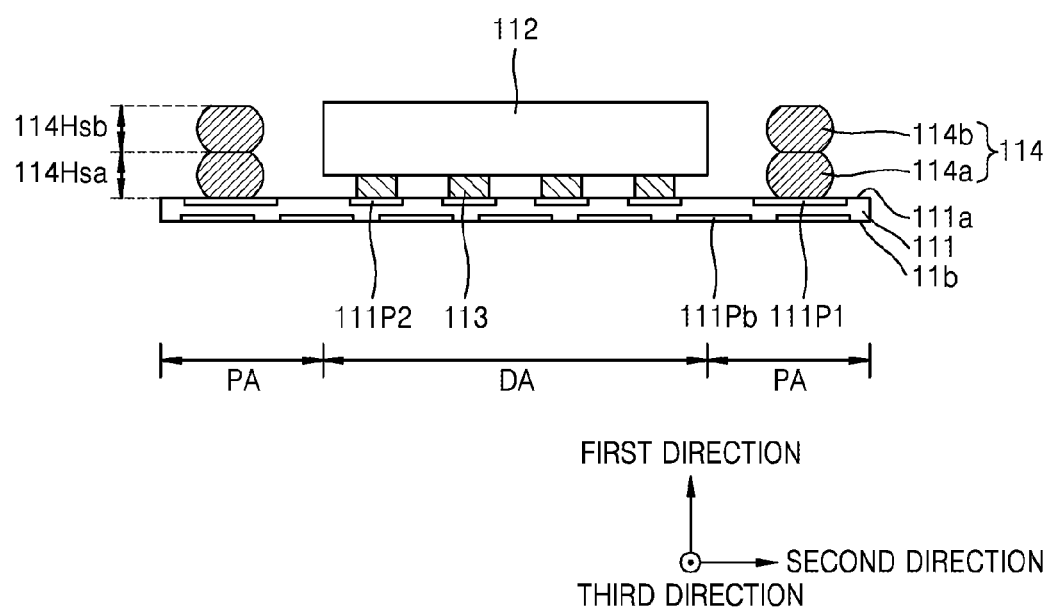

Referring to FIG. 6C, the second sub-stubs 114b may be respectively formed on the first sub-stubs 114a. Accordingly, the one first sub-stub 114a and the one second sub-stubs 114b stacked on the first sub-stub 114a may constitute the stub 114.

The second sub-stubs 114b may be formed using the wire bonding process similarly to a process of forming the first sub-stubs 114a.

In some example embodiment, the length 114Hsb of the second sub-stubs 114b in the first direction may be substantially the same as the length 114Hsa of the first sub-stub 114a in the first direction but is not limited thereto.

Meanwhile, the stubs 114 are illustrated to be formed after the first semiconductor chip 112 is mounted on the first substrate 111 in the example embodiment, but a process order is not limited thereto. That is, the first semiconductor chip 112 may be mounted on the first substrate 111 after the stubs 114 are formed on the first substrate 111.

Figure 6D:
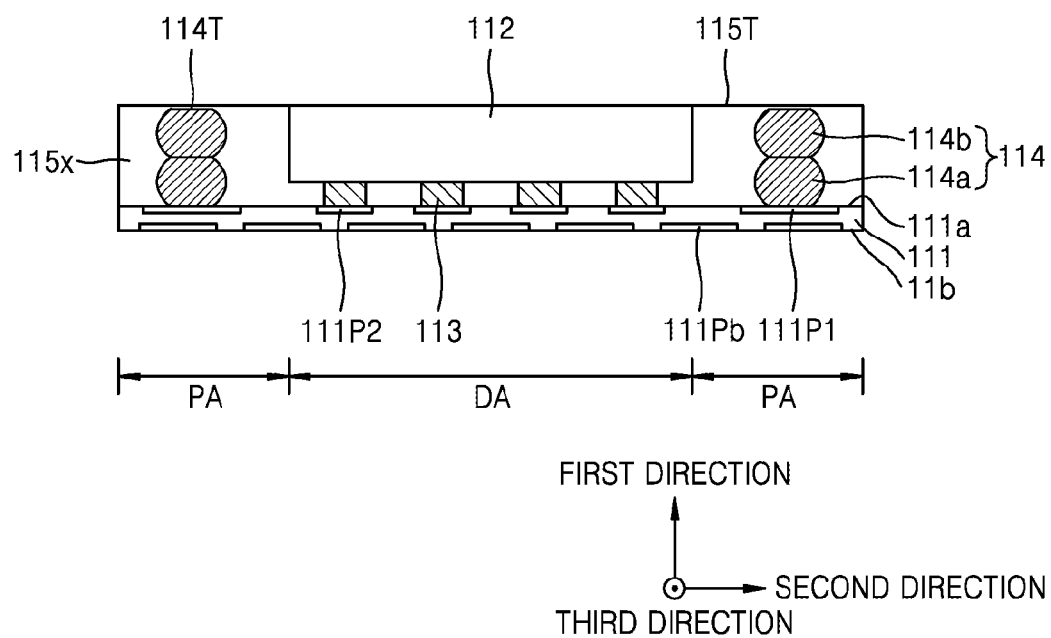

Referring to FIG. 6D, a first molding unit 115x may be formed to cover a side surface of the first semiconductor chip 112, the chip connection member 113, and the stubs 114.

The first molding unit 115x of FIG. 6D is formed to cover only the side surface of the first semiconductor chip 112 but is not limited thereto. For example, the first molding unit 115x may be formed to cover not only the side surface of the first semiconductor chip 112 but also an upper surface thereof.

In some example embodiments, the first molding unit 115x may be formed to cover the upper surfaces 114T of the stubs 114. That is, an upper surface 115T of the first molding unit 115x may be located at a level that is higher than the level of the upper surfaces 114T of the stubs 114.

In some other example embodiments, the upper surface 115T of the first molding unit 115x may be located at substantially the same level as the level of the upper surfaces 114T of the stubs 114. That is, the upper surfaces 114T of the stubs 114 may be exposed without being covered by the first molding unit 115x, unlike as shown in FIG. 6D. In this case, a process of forming the concave portions 115C that will be described with reference to FIG. 6E later may be omitted.

A process of forming the first molding unit 115x may include injecting molding resin in a molding apparatus (not shown), applying pressure using a pressure element (not shown) such as a press, etc.

In some example embodiments, the molding resin may include epoxy-based molding resin or polyimide-based molding resin, etc. The epoxy-based molding resin may include, for example, polycyclic aromatic epoxy resin, bisphenol-based epoxy resin, naphthalene-based epoxy resin, o-cresol novolac epoxy resin), dicyeclopentadiene epoxy resin, biphenyl-based epoxy resin, or phenol novolac epoxy resin, etc.

In some example embodiments, the molding resin may contain carbon black as a colorant. Meanwhile, the molding resin may further contain a hardener, a hardening accelerator, filler, a flame retardant, etc., as the colorant, in addition to the carbon black.

Figure 6E:
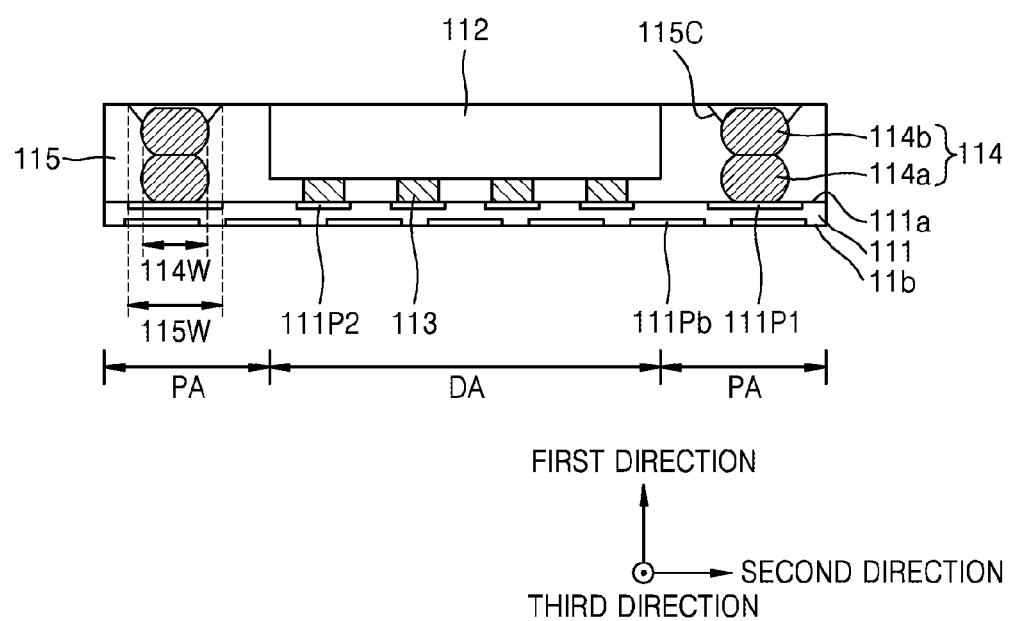

Referring to FIG. 6E, the plurality of concave portions 115C may be formed to expose partial upper areas of the stubs 114 so that the first molding unit 115 including the concave portions 115C may be formed.

In some example embodiments, the width 115W of the concave portions 115C in a second direction may be greater than the width 114W of the stubs 114 in the second direction.

The concave portions 115C may be formed through, for example, a laser drilling process. As an example, the laser drilling process may be performed using a laser light source having an excellent linearity such as gas laser such as helium-neon laser, excimer laser, etc., solid laser such as ruby laser, Nd:YAG laser, etc., semiconductor laser, etc.

The first molding unit 115 may partially cover a lower area and partially expose an upper area of the stub 114 by forming the concave portions 115C.

Figure 6F:
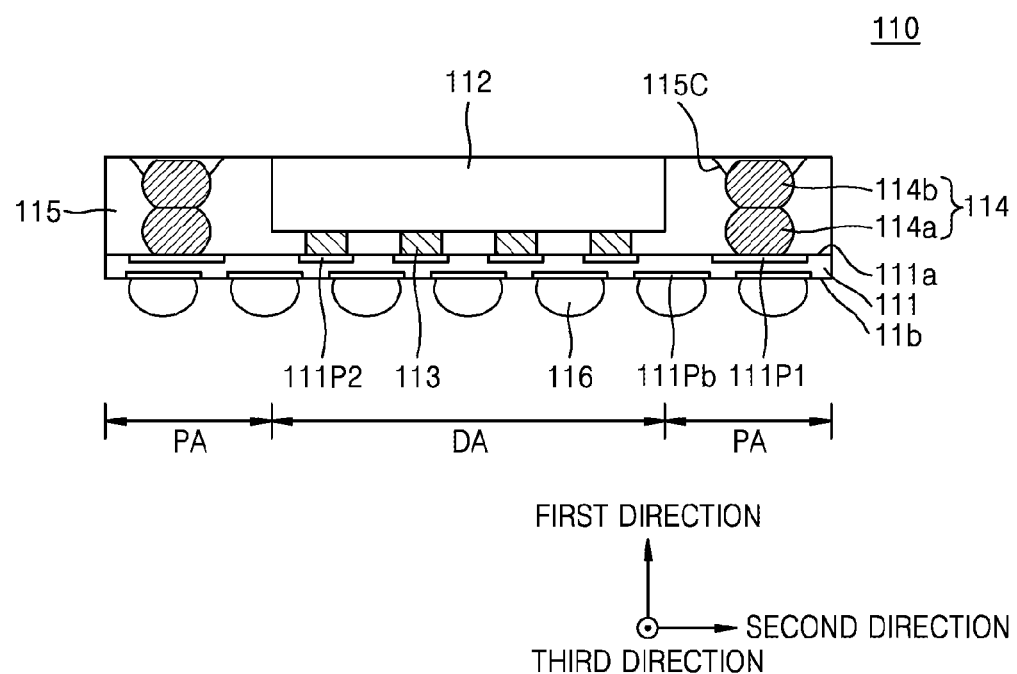

Referring to FIG. 6F, the first external connection members 116 may be formed on the lower pads 111Pb located on the lower surface 111b of the first substrate 111. The first external connection members 116 may be or include, for example, solder balls.

Figure 6G:
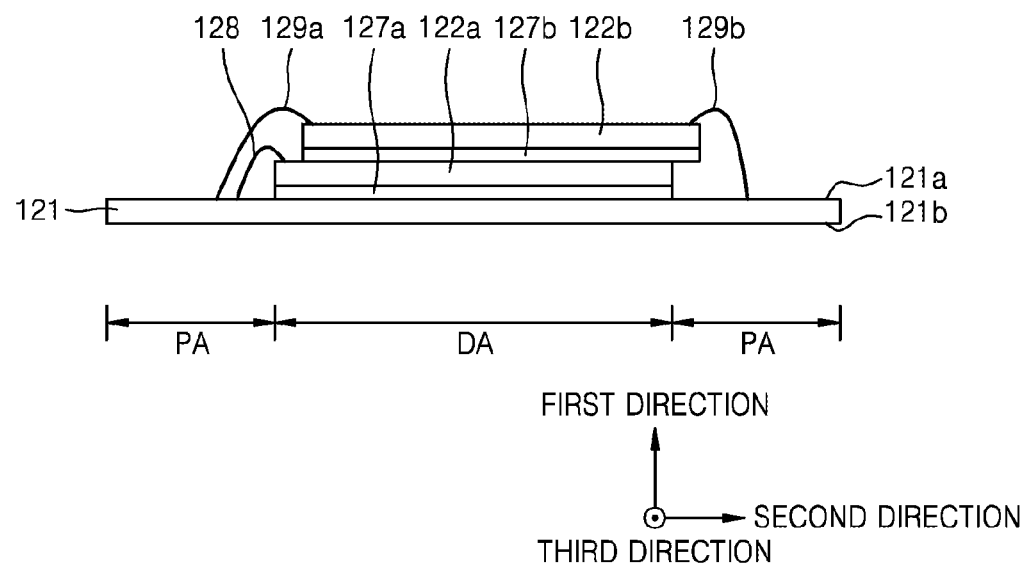

Referring to FIG. 6G, the second substrate 121 having the flat panel structure including the upper surface 121a and the lower surface 121b may be prepared. The second semiconductor chips 122a and 122b may be mounted on the second substrate 121.

In more detail, the second semiconductor chip 122a may be attached onto the second substrate 121 through the adhesive member 127a, and the second semiconductor chip 122b may be attached onto the second semiconductor chip 122a through the adhesive member 127b.

The adhesive members 127a and 127b may be formed using, for example, spin coating, painting, or spraying, etc.

Thereafter, the bonding wires 128, 129a, and 129b may be used to connect the second semiconductor chips 122a and 122b to the second substrate 121.

In some example embodiments, the bonding wires 128, 129a, and 129b may be formed in a forward folded loop mode in which one end of each or of one or more of the bonding wires 128, 129a, and 129b is firstly ball bonded to chip pads (not shown) of the second semiconductor chips 122a and 122b, and the other end thereof is secondly stitch bonded to upper pads (not shown) formed in the upper surface 121a of the second substrate 121.

In some other example embodiments, the bonding wires 128, 129a, and 129b may be formed in a reverse loop mode in which one end of each or of one or more of the bonding wires 128, 129a, and 129b is firstly ball bonded to the upper pads (not shown) formed in the upper surface 121a of the second substrate 121 and the other end thereof is secondly stitch bonded to conductive bumps (not shown) formed on the chip pads (not shown) of the second semiconductor chips 122a and 122b.

Figure 6H:
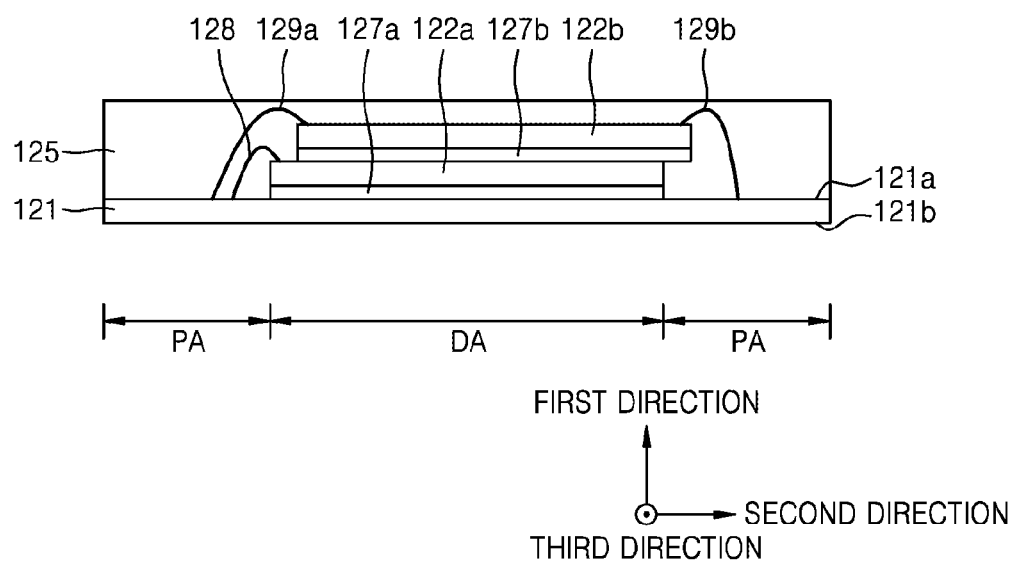

Referring to FIG. 6H, the second molding unit 125 may be formed on the second substrate 121 to cover the second semiconductor chips 122a and 122b and the bonding wires 128, 129a, and 129b. The second molding unit 125 may be formed using a process similar to the process of forming the first molding unit 115x described with reference to FIG. 6D above.

Figure 6I:
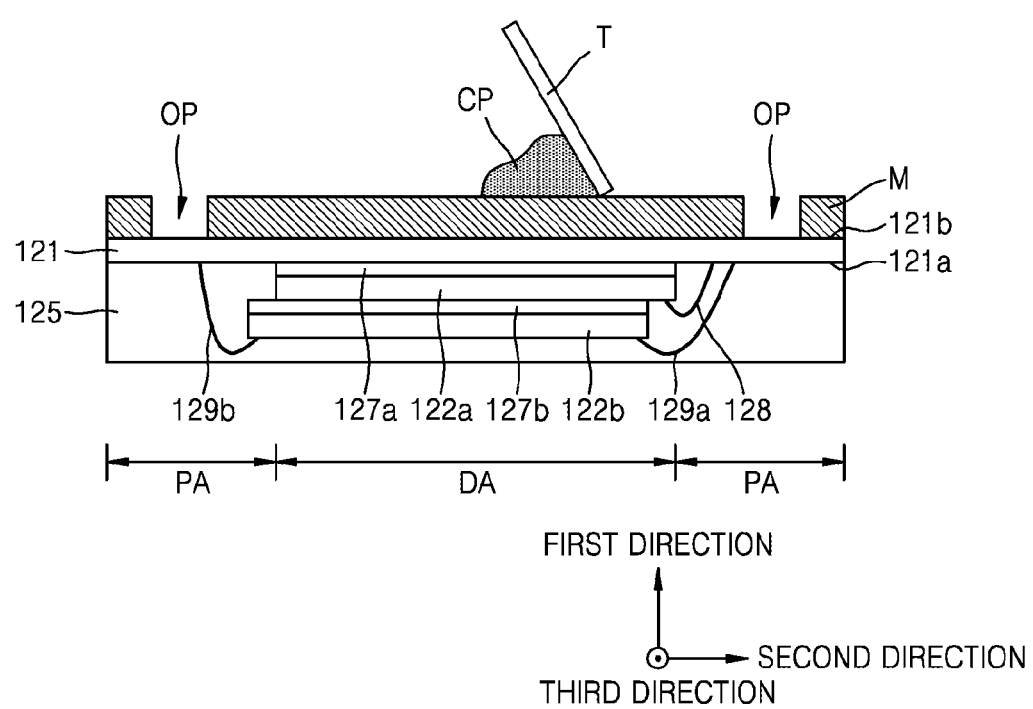

Referring to FIG. 6I, a mask M in which openings OP are formed may be formed on the lower surface 121b of the second substrate 121. The openings OP may expose lower pads (not shown) located on the lower surface 121b of the second substrate 121.

After the mask M is formed, a conductive paste (CP) may be coated thereon such that at least a part of the openings OP may be filled. The CP may be or include, for example, a solder paste. The CP may be coated by using, for example, a paste coating tool T.

After the CP is coated, the mask M may be removed. Accordingly, the CP may remain on the lower pads (not shown) located on the lower surface 121b of the second substrate 121.

Figure 6J:
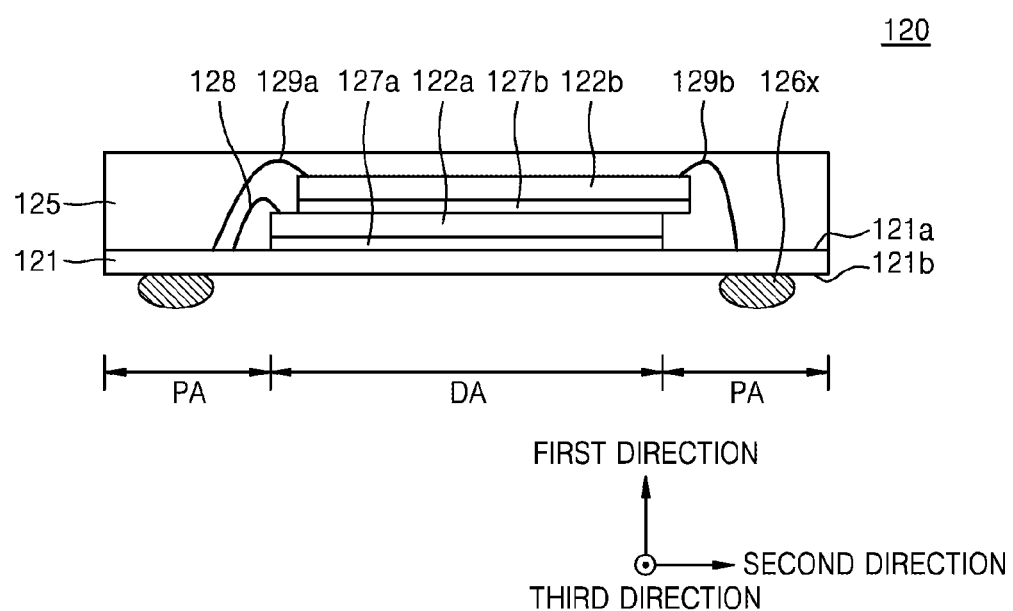

Referring to FIG. 6J, second external connection members 126x may be formed by reflowing the CP remaining on the lower pads (not shown) located on the lower surface 121b of the second substrate 121. The second external connection members 126x may be or include, for example, solder balls.

In some example embodiments, the second external connection members 126x may include a compound containing tin (Sn). For example, the second external connection members 126x may include tin (Sn), tin-lead (Sn—Pb), tin-silver-copper (Sn—Ag—Cu), tin-silver (Sn—Ag), tin-copper (Sn—Cu), tin-bismuth (Sn—Bi), tin-zinc-bismuth (Sn—Zn—Bi), tin-silver-bismuth (Sn—Ag—Bi), tin-silver-zinc (Sn—Ag—Zn), indium-tin (In—Sn), indium-silver (In—

Ag), tin-lead-silver (Sn—Pb—Ag), indium-lead (In—Pb), tin-lead-bismuth (Sn—Pb—Bi), tin-lead-bismuth-silver (Sn—Pb—Bi—Ag), etc.

Figure 6K:
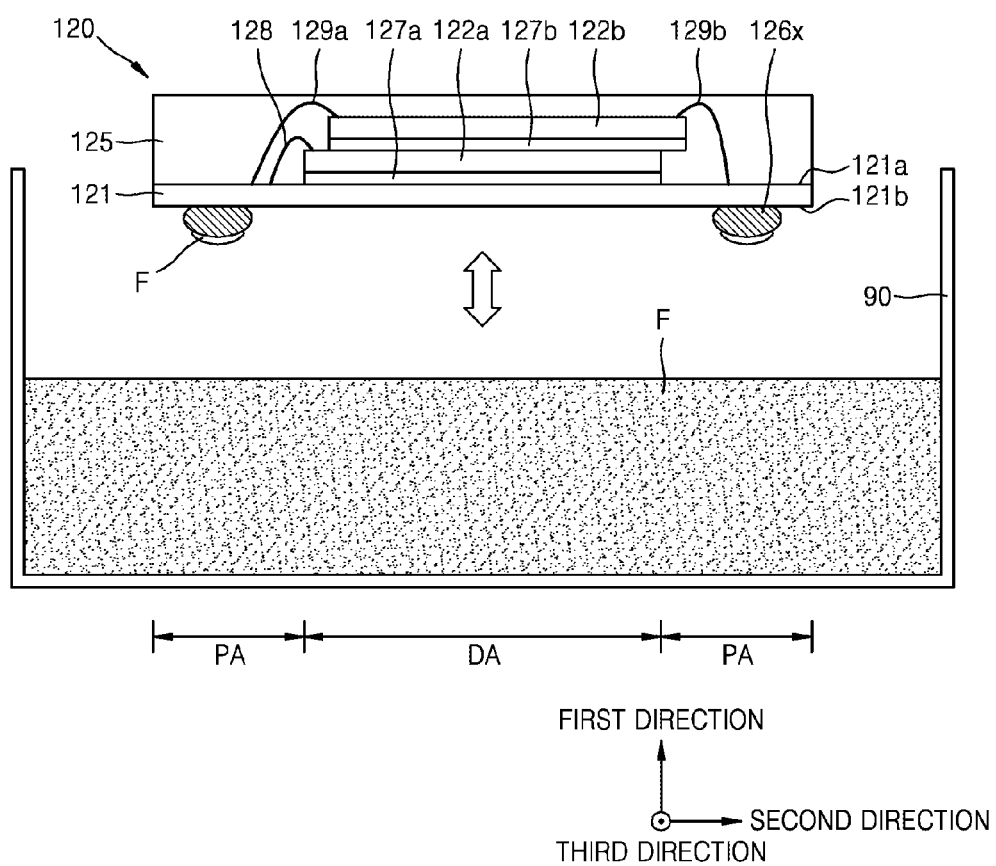

Referring to FIG. 6K, a container 90 containing a flux solvent F may be prepared. The second package 120 may be lowered such that at least a partial area of the second external connection members 126x may be contained in the flux solvent F.

In some example embodiments, the flux solvent F may include a material having a fluxing function such as carboxylic acid, a sulfur-containing phenol compound, a phenol resin, phenol-group carboxylic acid, acid anhydride, an aromatic hydrazide, rosin, derivatives of rosin, and synthetic resin, etc.

Figure 6L:
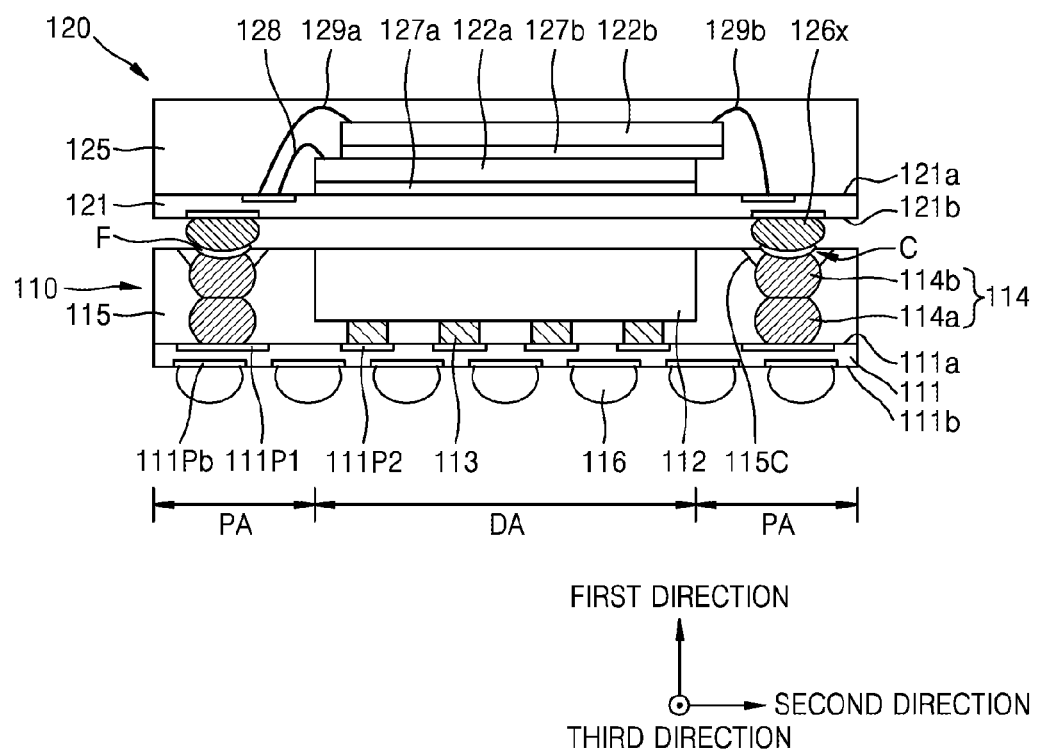

Referring to FIG. 6L, the second package 120 may be stacked on the first package 110. Accordingly, the second external connection members 126x stained with the flux solvent F may be respectively disposed on the stubs 114.

Figure 6M:
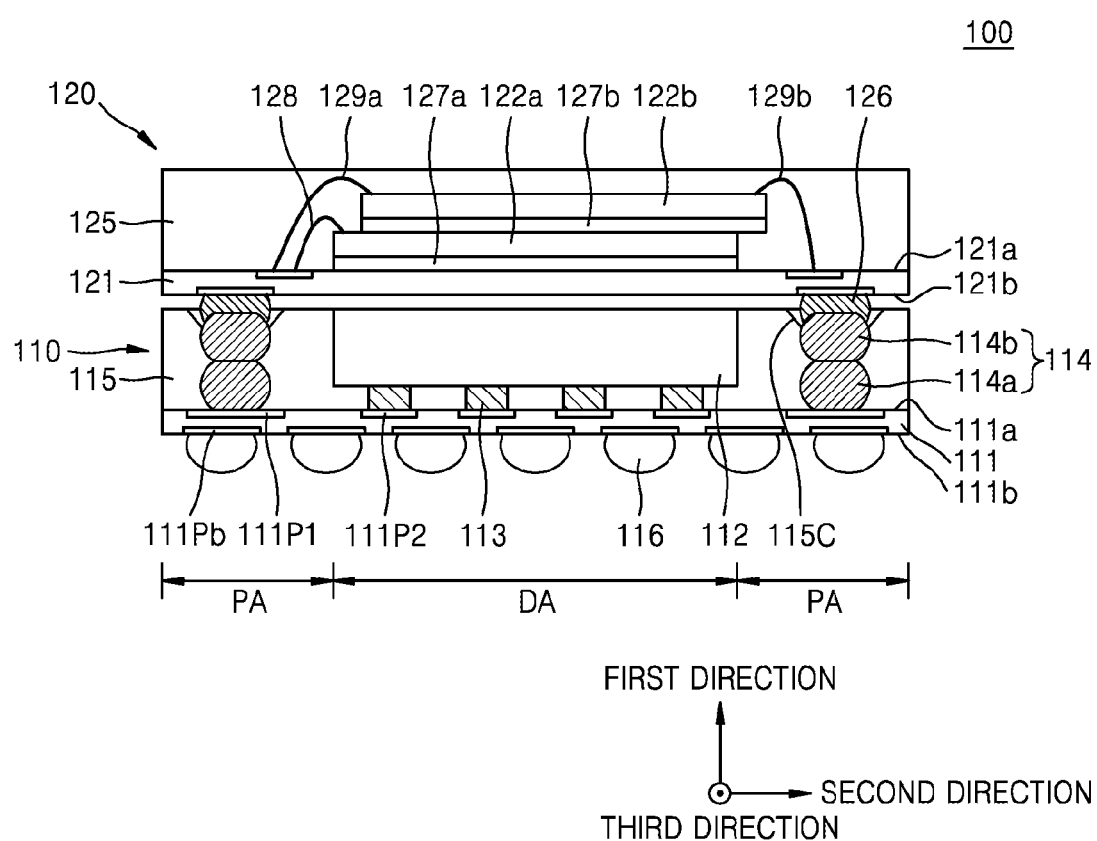

Referring to FIG. 6M, the second external connection members 126 may be formed by performing a reflow process on the second external connection members 126x of the second package 120. The second external connection members 126 may be physically bound to the stubs 114 through the reflow process. That is, the semiconductor package 100 may be completed by physically binding the first package 110 and the second package 120.

During the reflow process, at least a partial area of each or of one or more of the second external connection members 126x may have fluidity and flow into each or one or more of the concave portions 115C of the first molding unit 115. In this regard, a side wall of each or of one or more of the concave portions 115C may be used as a barrier for hindering or substantially preventing a short circuit between the adjacent second external connection members 126x having fluidity.

When the second external connection members 126x include the compound containing tin (Sn) and the second sub-stubs 114b include gold (Au), silver (Ag), copper (Cu), palladium (Pd), or an alloy thereof in the example embodiment, the second external connection members 126x may be reflowed while a shape of the second sub-stubs 114b is remained during the reflow process. This is because the second external connection members 126x have a low melting point in the range from about 100° C. to about 150° C. when the second external connection members 126x include the compound containing tin (Sn) and second sub-stubs 114b have a high melting point in the range from about 900° C. to about 1000° C. when the second sub-stubs 114b include gold (Au), silver (Ag), copper (Cu), palladium (Pd), or an alloy thereof.

However, when the second external connection members 126x and the second sub-stubs 114b have different compositions from that in the example embodiment, the second sub-stubs 114b may be reflowed while a shape of the second external connection members 126x remains during the reflow process.

FIGS. 7A through 7F are cross-sectional views sequentially showing a method of manufacturing the first sub-stubs 114a (see FIG. 6B), according to an example embodiment. The same reference numerals refer to the same elements between FIGS. 7A through 7F and FIGS. 1A through 6M, and thus redundant descriptions thereof will be omitted for convenience of description.

Figure 7A:
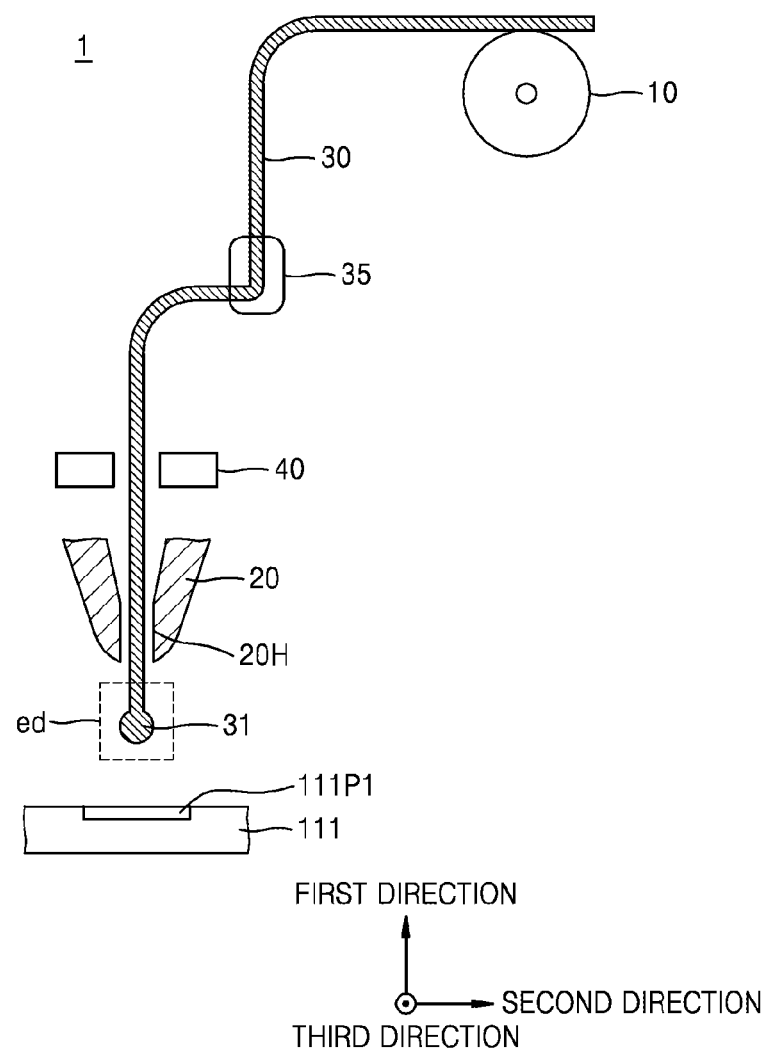
FIGS. 7A through 7F are cross-sectional views sequentially showing a method of manufacturing first sub-stubs, according to an example embodiment.

Referring to FIG. 7A, the substrate 111 and a wire bonding apparatus 1 may be prepared.

The wire bonding apparatus 1 may include a spool unit 10, a wire guide 35, a capillary 20, and clamps 40.

The spool unit 10 may be wound around with a conductive wire 30. The capillary 20 may be designed to be movable in first through third directions of FIG. 7a in order to perform wire bonding on a desired location. The clamps 40 may be installed in both sides of the conductive wire 30 to tighten or loosen the conductive wire 30 and apply a desired, or alternatively predetermined potential to the conductive wire 30. The clamps 40 may cut off the conductive wire 30 by applying tension to the capillary 20 including the conductive wire 30 in the first direction.

The conductive wire 30 may pass through the wire guide 35 and the clamps 40 and may be inserted into a though hole 20H of the capillary 20.

A conductive ball 31 may be formed in an end area "ed" of the conductive wire 30. The conductive ball 31 may be formed according to an instantaneous spark discharge that occurs when the conductive wire 30 that receives the desired, or alternatively predetermined potential from the clamps 40 is in contact with a discharge a load (not shown) that may supply a discharge voltage. That is, the conductive ball 31 may be formed by a process of instantaneously, or substantially instantaneously, melting and cooling the end area "ed" of the conductive wire 30 according to the spark discharge.

The conductive wire 30 and the conductive ball 31 may include at least one of gold (Au), silver (Ag), copper (Cu), palladium (Pd), or an alloy thereof, but are not limited thereto.

Figure 7B:
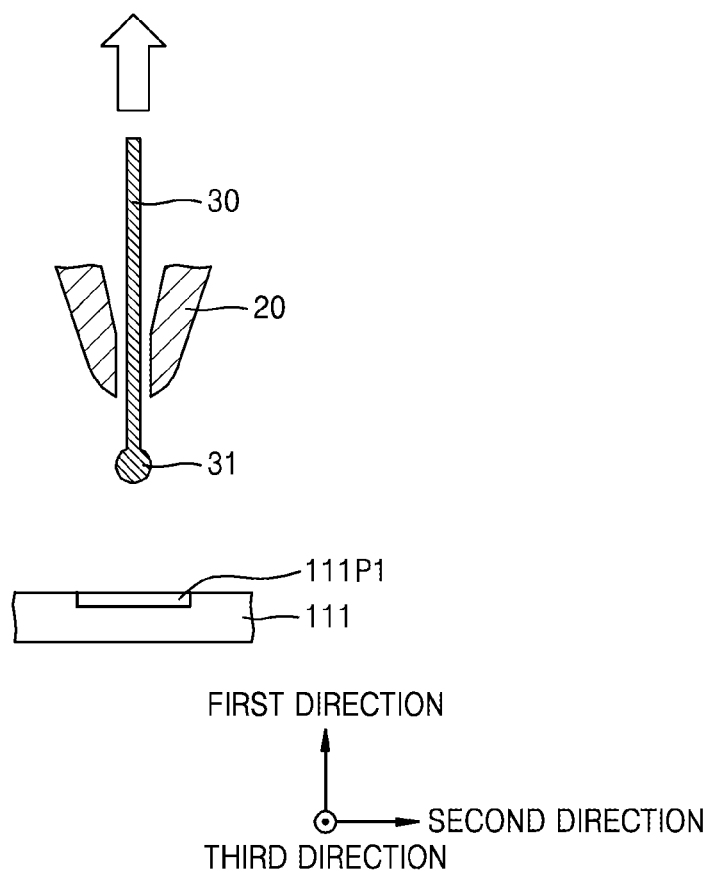

Referring to FIG. 7B, the conductive wire 30 may be moved in a first direction such that the conductive ball 31 may be closer to the capillary 20.

In some example embodiments, the conductive ball 31 is closer to the capillary 20, and thus the conductive ball 31 may be in contact with the capillary 20 but is not limited thereto.

Figure 7C:
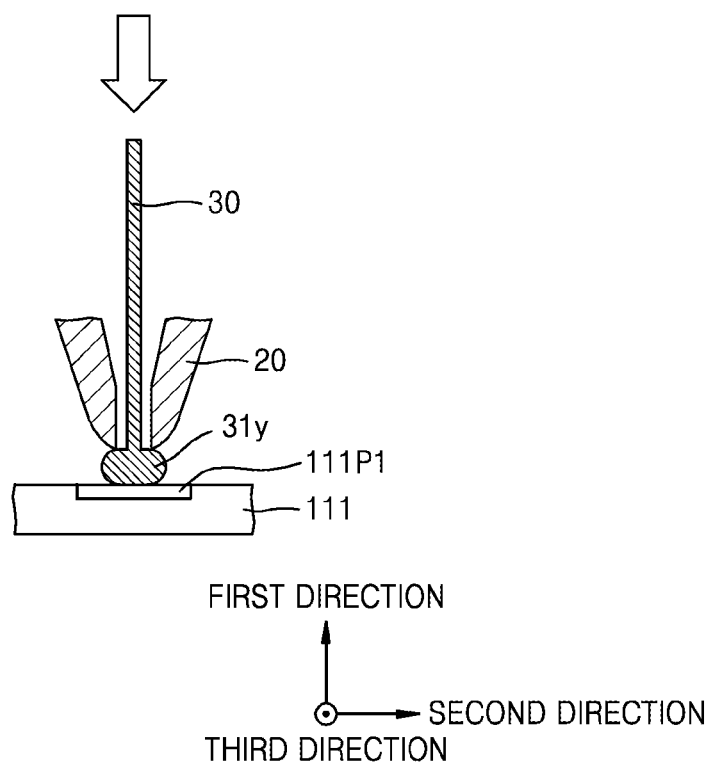

Referring to FIG. 7C, the conductive wire 30, the conductive ball 31, and the capillary 20 may be moved in a direction (a direction toward the first substrate 111) that is opposite to the first direction such that the conductive ball 31 (see FIG. 7B) may be in contact with the first upper pad 111P1 of the first substrate 111. After the conductive ball 31 is in contact with the first upper pad 111P1, heating, pressing, and/or ultrasonic vibrating process may be performed on the conductive ball 31. The conductive ball 31 of FIG. 7B may mean or include a conductive ball before being attached to the first upper pad 111P1. A conductive ball 31y of FIG. 7C may mean or include a conductive ball attached to the first upper pad 111P1 using the heating, pressing, and/or ultrasonic vibrating process.

Figure 7D:
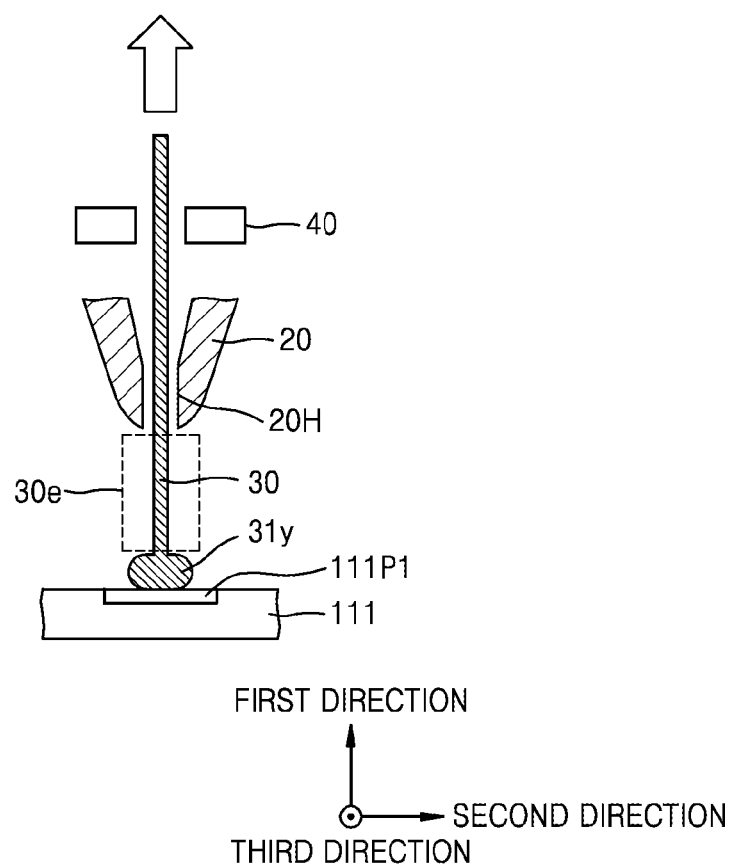

Referring to FIG. 7D, the capillary 20 may be moved in the first direction. In this regard, the clamps 40 may be open as shown in FIG. 7D. Accordingly, a partial area 30e of the conductive wire 30 may be escaped from the capillary 20.

Figure 7E:
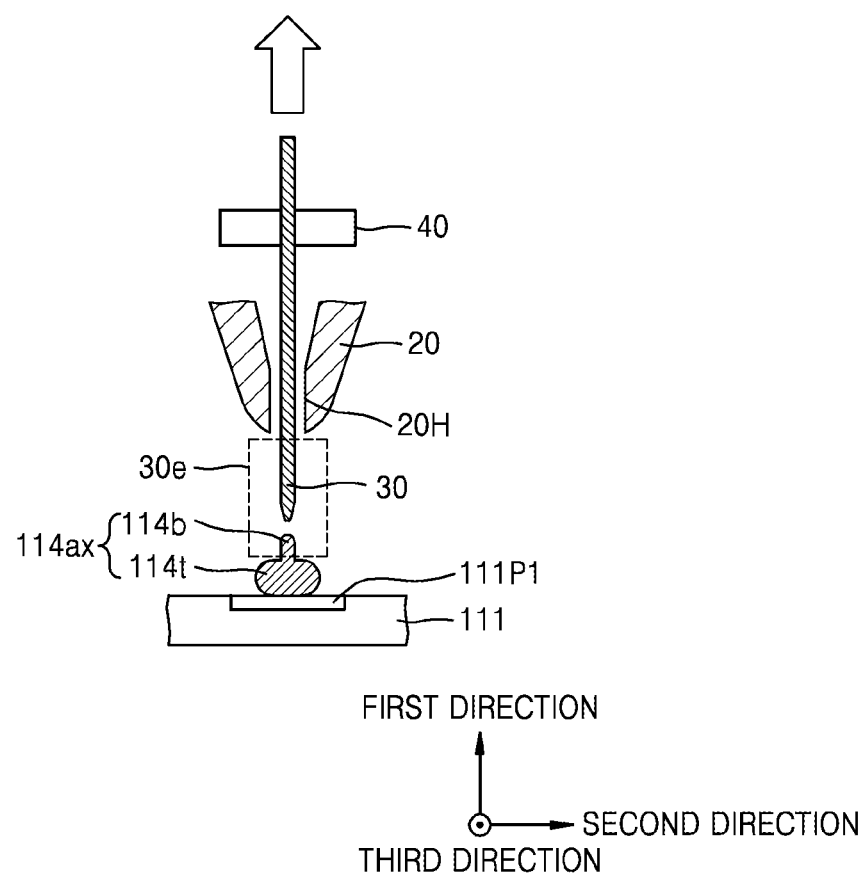

Referring to FIG. 7E, a first sub-stub 114ax may be formed by cutting off the conductive wire 30 in the partial area 30e of the conductive wire 30 escaped from the capillary 20. To this end, the capillary 20 may be moved in the first direction while the conductive wire 30 is fixed by closing the clamps 40.

The first sub-stub 114ax may include a body unit 114b and a tail unit 114t. That is, the first sub-stub 114ax may have a nail-headed shape.

Figure 7F:
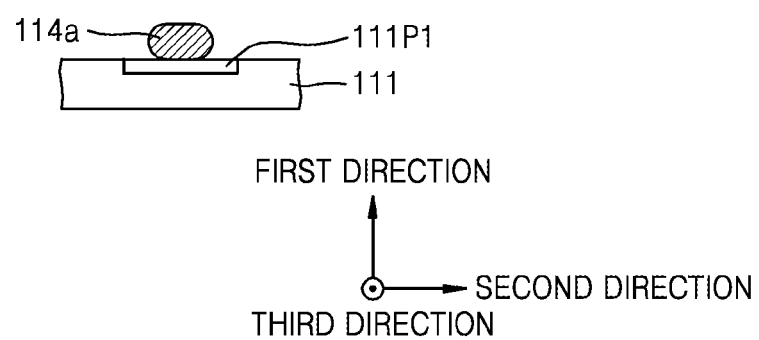

Referring to FIG. 7F, the first sub-stub 114a may be completed by removing the tail unit 114t (see FIG. 7E) of the first sub-stub 114ax (see FIG. 7E).

A process of removing the tail unit 114t (see FIG. 7E) may be performed through cutting, etc. but is not limited thereto.

The first sub-stub 114a may have a flat upper surface by removing the tail unit 114t (see FIG. 7E), thereby increasing reliability of the first sub-stub 114a.

However, the process of removing the tail unit 114t (see FIG. 7E) described with reference to FIG. 7F above may be omitted. That is, a process of forming the second sub-stub 114b described with reference to FIG. 6C above may be performed on a first sub-stub 114ax (see FIG. 7E).

Although the method of manufacturing the first sub-stubs 114a (see FIG. 6B) is described with reference to FIGS. 7A through 7F, a method of manufacturing the second sub-stubs 114b (see FIG. 6C) may be also similarly applied.

The first sub-stubs 114a and/or the second sub-stubs 114b may be formed using a wire bonding process in the example embodiment, thereby simplifying a process of manufacturing a semiconductor package and simultaneously or contemporaneously reducing process cost.

FIGS. 8A through 8D are cross-sectional views sequentially showing a method of manufacturing the first sub-stubs 114a (see FIG. 6B), according to another example embodiment. The same reference numerals refer to the same elements between FIGS. 8A through 8D and FIGS. 1A through 7F, and thus redundant descriptions thereof will be omitted for convenience of description.

Figure 8A:
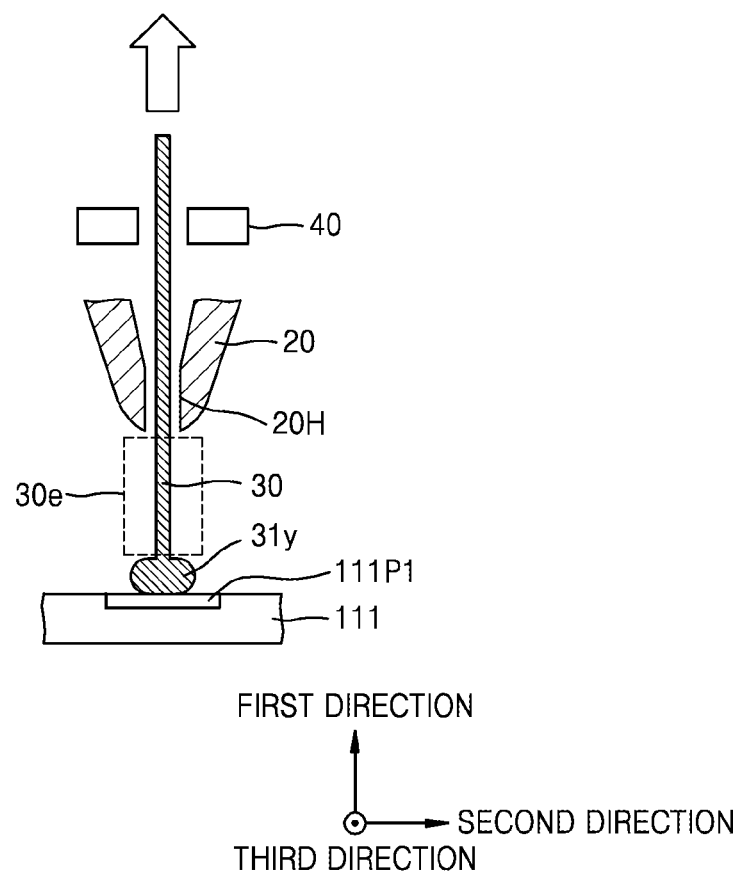
FIGS. 8A through 8D are cross-sectional views sequentially showing a method of manufacturing first sub-stubs, according to another example embodiment.

Referring to FIG. 8A, the conductive ball 31y may be attached onto the first upper pad 111P1 of the first substrate 111, and the capillary 20 may be moved in a first direction such that the partial area 30e of the conductive wire 30 may be escaped from the capillary 20. This is described in detail with reference to FIGS. 7A through 7D above, and thus a description thereof is omitted.

Figure 8B:
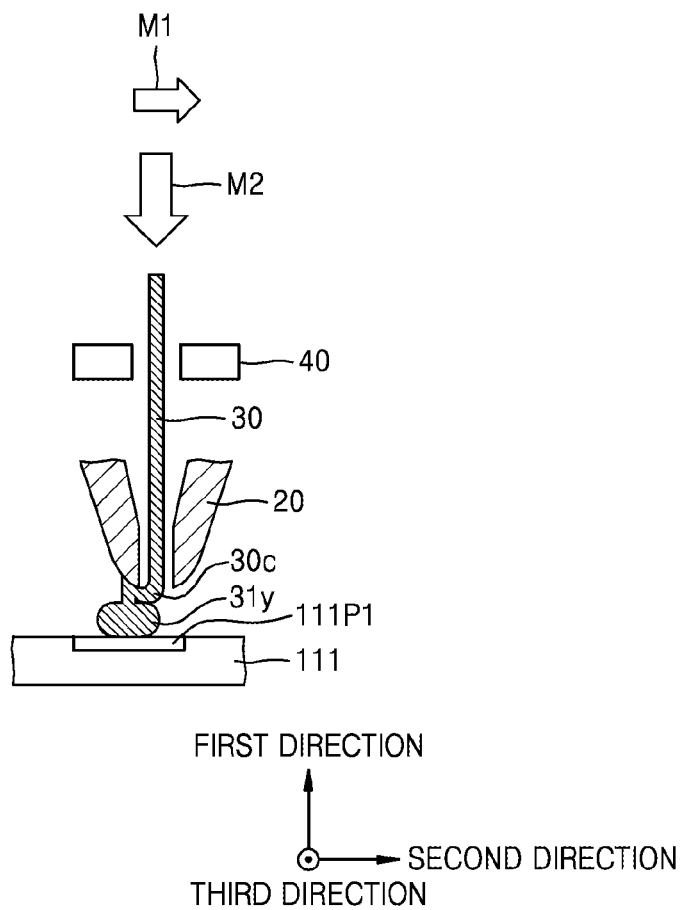

Referring to FIG. 8B, after the capillary 20 is slightly moved (a first movement M1) in a second direction, the capillary 20 may be moved (a second movement M2) in a direction opposite to the first direction (toward the first substrate 111).

The first movement M1 of the example embodiment follows the second direction but is not limited thereto. The first movement M1 is not limited to the second direction, but may be any direction within a plane substantially perpendicular to the first direction.

A curve unit 30c may be formed in the conductive wire 30 according to the second movement M2. Heating and/or pressing process may be performed on the curve unit 30c.

Figure 8C:
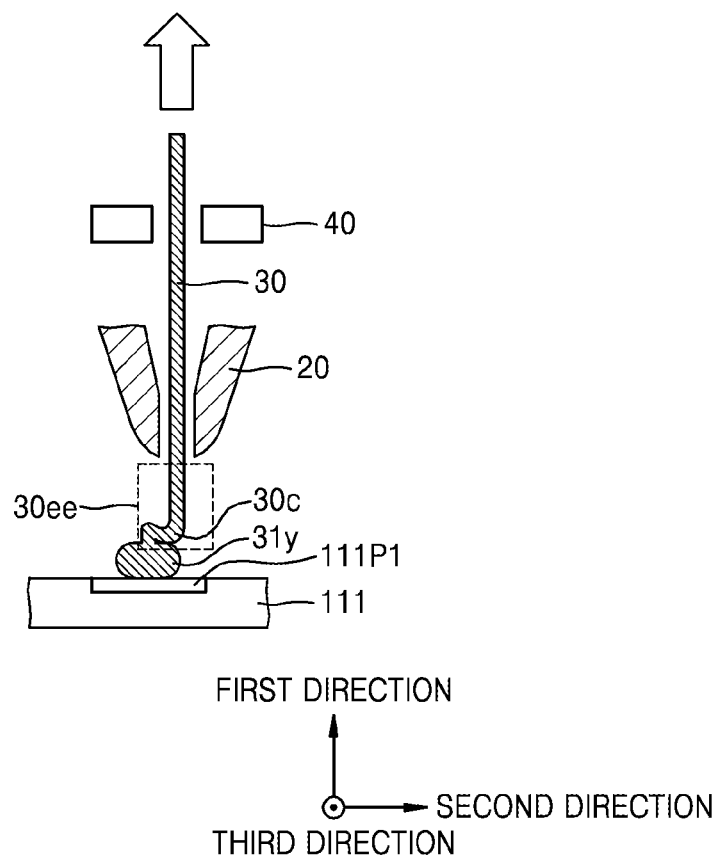

Referring to FIG. 8C, the capillary 20 may be moved in the first direction. In this regard, the clamps 40 may be open as shown in FIG. 8C. Accordingly, a partial area 30ee of the conductive wire 30 may be escaped from the capillary 20.

Figure 8D:
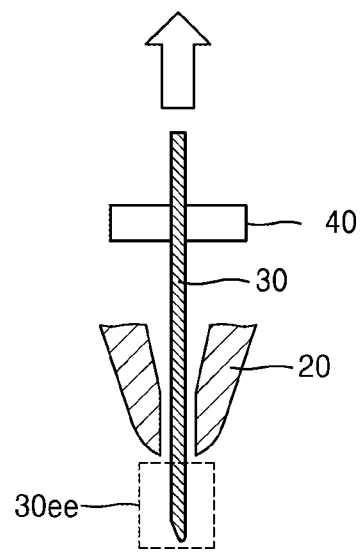
Figure 8D:
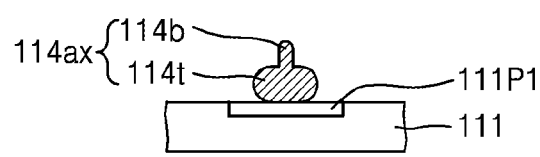
Figure 8D:
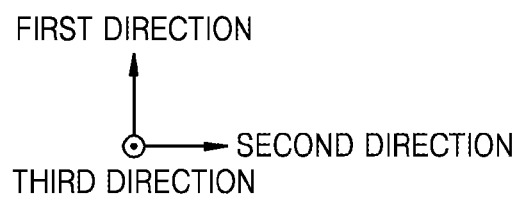

Referring to FIG. 8D, the first sub-stub 1114ax may be formed by cutting off the conductive wire 30 in the partial area 30ee of the conductive wire 30 escaped from the capillary 20. To this end, the capillary 20 may be moved in the first direction while the conductive wire 30 is fixed by closing the clamps 40.

The first sub-stub 114ax may include the body unit 114b and the tail unit 114t. That is, the first sub-stub 114ax may have a nail-headed shape.

Although not shown, the first sub-stub 114a (see FIG. 7F) may be completed by removing the tail unit 114t of the first sub-stub 114ax, which is described with reference to FIG. 7F and thus, a description thereof is omitted.

FIGS. 9A through 9E are cross-sectional views sequentially showing a method of manufacturing the semiconductor device 100, according to another example embodiment. The same reference numerals refer to the same elements between FIGS. 9A through 9E and FIGS. 1A through 5, and thus redundant descriptions thereof will be omitted for convenience of description.

Figure 9A:
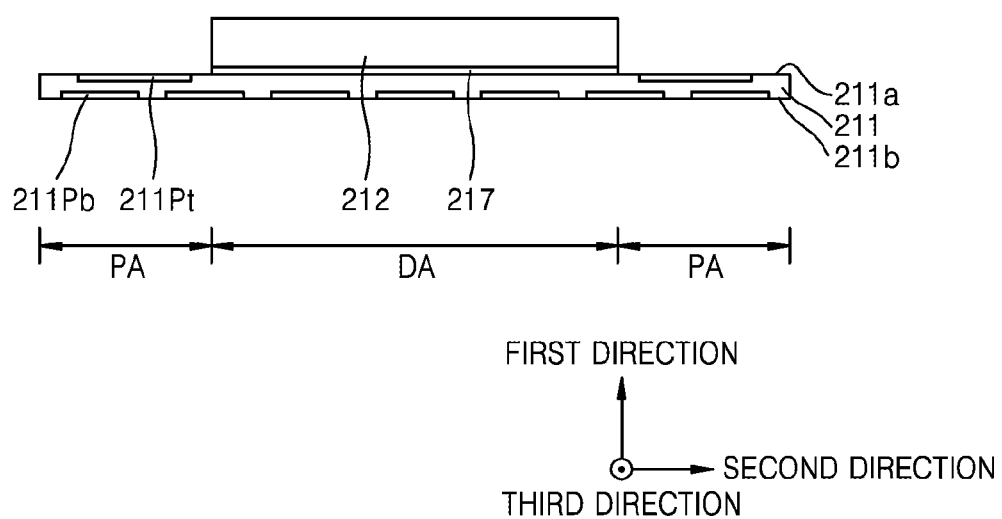
FIGS. 9A through 9E are cross-sectional views sequentially showing a method of manufacturing a semiconductor device, according to another example embodiment.

Referring to FIG. 9A, the first substrate 211 having a flat panel structure including the upper surface 211a and the lower surface 211b may be prepared. The first semiconductor chip 212 may be attached to the upper surface 211a of the first substrate 211. The first semiconductor chip 212 may be attached onto the first substrate 211 through the adhesive member 217.

Figure 9B:
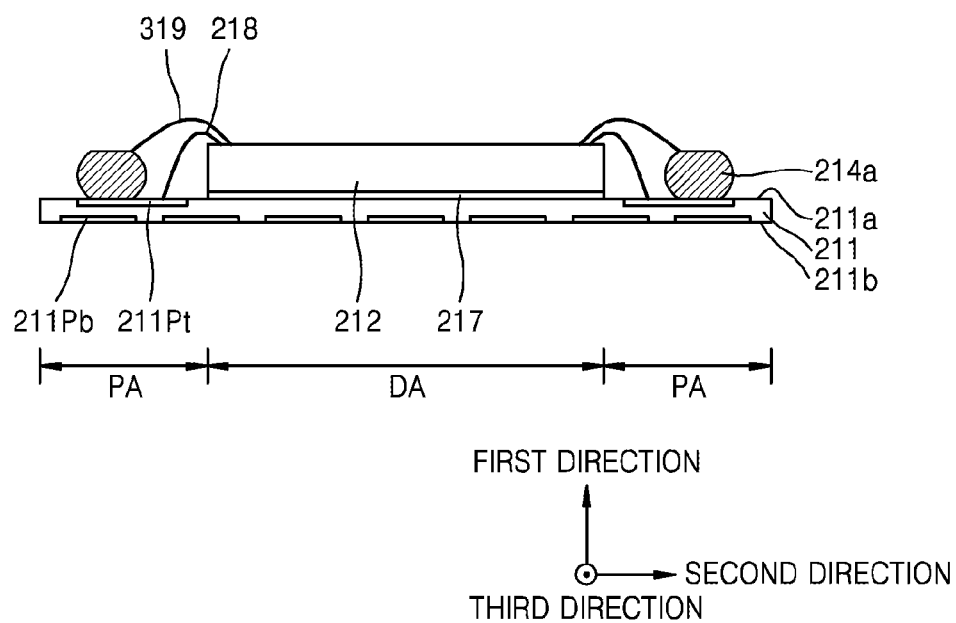

Referring to FIG. 9B, the first sub-stubs 214a may be respectively formed on the upper pads 211Pt. The first sub-stubs 214a may be formed using a wire bonding process described with reference to FIGS. 7A through 8C above.

In some example embodiments, the first sub-stubs 214a and the bonding wire 319 may be formed using a single wire bonding process. That is, after the first sub-stubs 214a are formed, the bonding wire 319 may be formed by connecting a wire that may extend from the first sub-stubs 214a to a chip pad of the first semiconductor chip 212 without cutting off the wire.

In some other example embodiments, after the first sub-stubs 214a are formed, the bonding wires 218 and 319 may be formed. In more detail, one of the chip pads (not shown) of the first semiconductor chip 212 and the upper pads 211Pt of the first substrate 211 may be connected through the bonding wire 218, and another one of the chip pads (not shown) of the first semiconductor chip 212 and the first sub-stub 214a may be connected through the bonding wire 319.

In some example embodiments, the bonding wires 218 and 319 may be formed using a forward folded loop mode method or a reverse loop mode method.

Figure 9C:
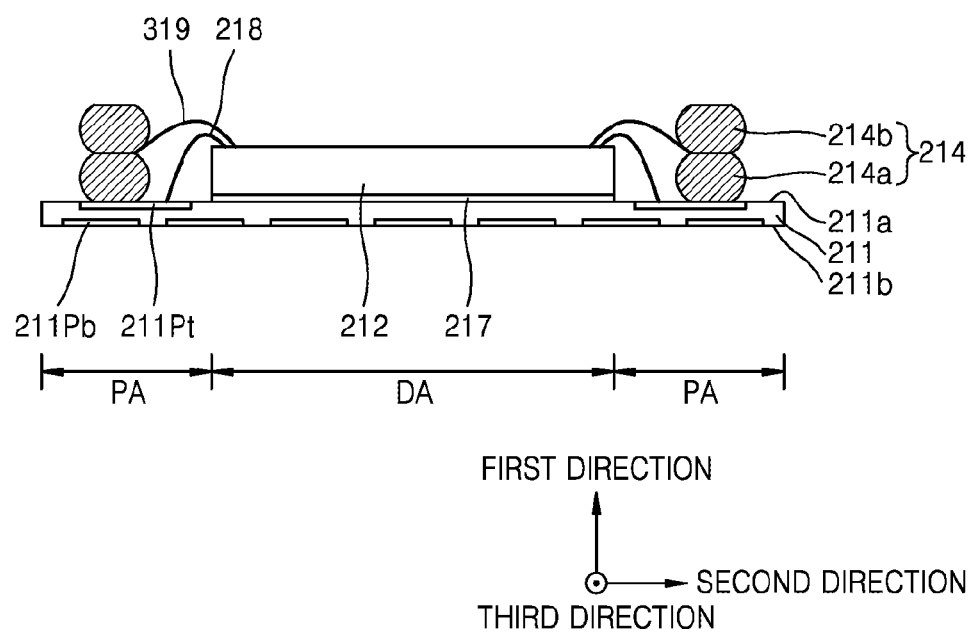

Referring to FIG. 9C, the second sub-stubs 214b may be formed on the first sub-stubs 214a. The second sub-stubs 214b may be formed using a wire bonding process similarly to a process of forming the first sub-stubs 214a. Accordingly, one end of the bonding wire 319 may be connected between the first sub-stubs 214a and the second sub-stubs 214b.

Figure 9D:
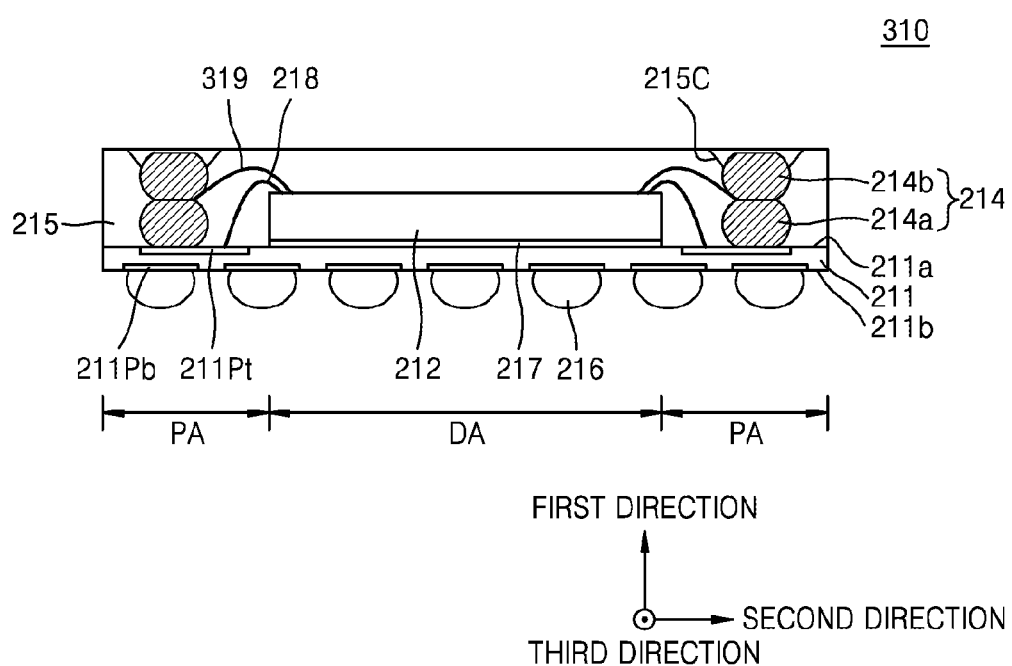

Referring to FIG. 9D, the first package 310 may be completed by forming the first molding unit 215 and the first external connection members 216.

In more detail, the first molding unit 215 including the plurality of concave portions 215C that cover the first semiconductor chip 212, the stubs 214, and the bonding wires 218 and 319 and expose at least partial upper areas of the stubs 214 may be formed on the upper surface 211a of the first substrate 215. The first external connection members 216 may be formed on the lower pads 211Pb located on the lower surface 211b of the first substrate 211.

The processes of forming the first molding unit 215 and the first external connection members 216 may be substantially the same as or similar to processes of forming the first molding unit 115 and the first external connection members 116 described with reference to FIGS. 6D through 6F above.

Figure 9E:
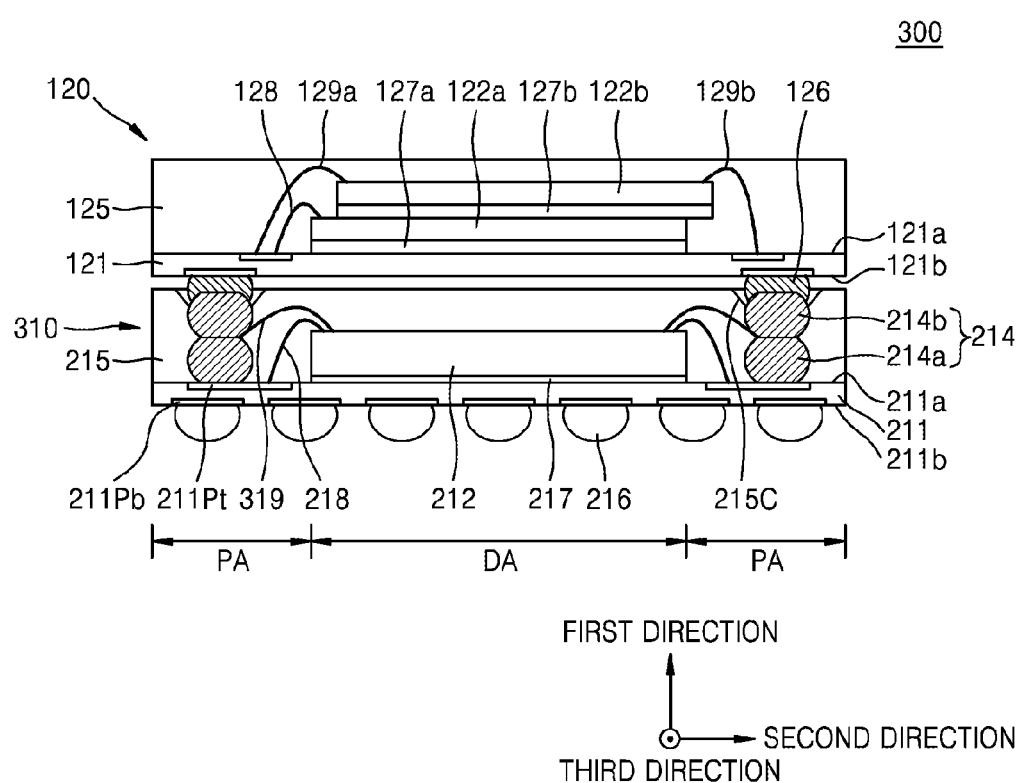

Referring to FIG. 9E, the second package 300 may be completed by attaching the second package 120 onto the first package 310. Processes of manufacturing and attaching the second package 120 are described with reference to FIGS. 6G through 6M above, and thus descriptions thereof are omitted.

A semiconductor package according to the example embodiments may include stubs disposed between external connection members of a lower package and an upper package, and thus even when the external connection members of the upper package have a fine pitch and are spaced apart from each other, a possibility of short circuit due to deformation, contamination, or misalignment of the external connection members may be reduced.

The stubs may be formed using the wire bonding process, thereby simplifying the process of manufacturing the semiconductor package and simultaneously reducing the process cost.

Figure 10:
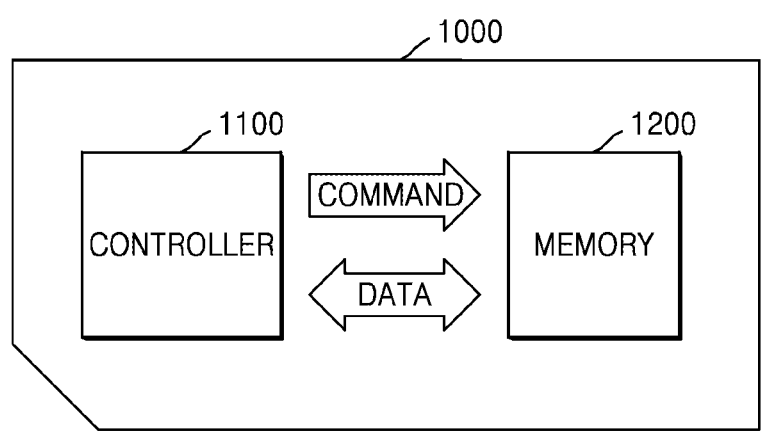
FIG. 10 is a schematic block diagram of a memory card including a semiconductor package, according to some example embodiments.

FIG. 10 is a schematic block diagram of a memory card 1000 including a semiconductor package according to some example embodiments.

Referring to FIG. 10, a controller 1100 and a memory 1200 may be disposed to exchange an electrical signal in the memory card 1000. For example, if the controller 1100 gives a command, the memory 1200 may transmit data. The controller 1100 and/or the memory 1200 may include a semiconductor package according to one of the example embodiments. The memory 1200 may include a memory array (not shown) or a memory array bank (not shown).

The memory card 1000 may be used in a memory device such as a memory stick card, a smart media card (SM), a secure digital card (SD), a mini secure digital card (mini SD), or a multi media card (MMC).

Figure 11:
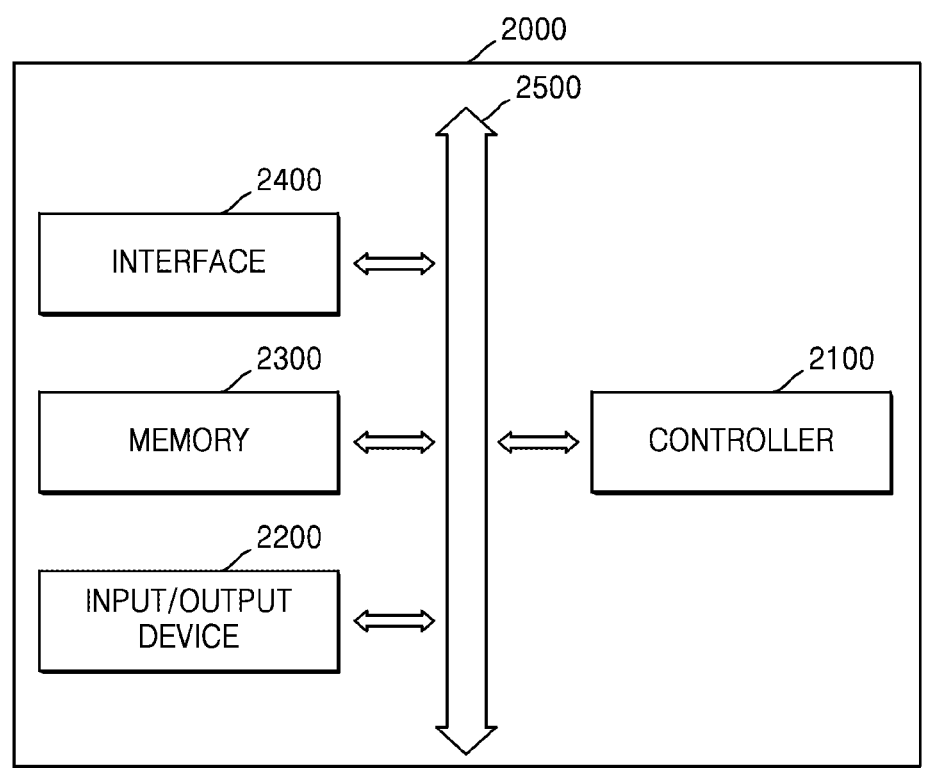
FIG. 11 is a schematic block diagram of an electronic system including a semiconductor package, according to some example embodiments.

FIG. 11 is a schematic block diagram of an electronic system 2000 including a semiconductor package according to some example embodiments.

Referring to FIG. 11, the electronic system 2000 may include a controller 2100, an input/output device 2200, memory 2300, and an interface 2400. The electronic system 2000 may be or include a mobile system or a system that transmits or receives information. The mobile system may be or include a PDA, a portable computer, a web tablet, a wireless phone, a mobile phone, a digital music player or a memory card.

The controller 2100 may execute a program and control the electronic system 2000. The controller 2100 may be or include, for example, a microprocessor, a digital signal processor, a microcontroller or a similar device. The input/output device 2200 may be used to input or output data of the electronic system 2000.

The electronic system 2000 may be connected to an external device, for example, a personal computer or a network, and exchange data with the external device by using the input/output device 2200. The input/output device 2200 may be or include, for example, a keypad, a keyboard, or a display. The memory 2300 may store code and/or data for an operation of the controller 2100 and/or store data processed by the controller 2100. The controller 2100 and the memory 2300 may include a semiconductor package according to one of the example embodiments. The interface 2400 may be or include a data transmission path between the electronic system 2000 and another external device. The controller 2100, the input/output device 2200, the memory 2300, and the interface 2400 may communicate with each other via a bus 2500.

For example, the electronic system 2000 may be used in a mobile phone, an MP3 player, a navigation system, a portable multimedia player (PMP), a solid state disk (SSD), or a household appliance.

Figure 12:
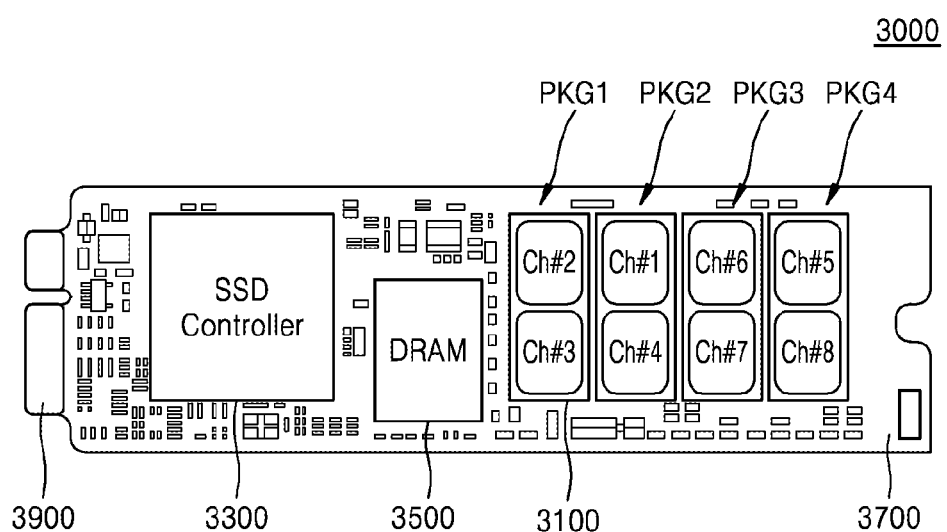
FIG. 12 is a schematic cross-sectional view of a solid state disk (SSD) device to which a semiconductor package, according to some example embodiments, is applied and shows an example in which the electronic system of FIG. 11 is applied to the SSD device.

FIG. 12 is a schematic cross-sectional view of a solid state disk (SSD) device 3000 to which a semiconductor package according to some example embodiments is applied and shows an example in which the electronic system 2000 of FIG. 11 is applied to the SSD device 3000.

Referring to FIG. 12, the SSD device 3000 of the example embodiment may include a memory package 3100, an SSD controller 3300, a dynamic random access memory (DRAM) 3500, and a main board 3700.

The memory package 3100, the SSD controller 3300, and the DRAM 3500 may include a semiconductor package according to one of the example embodiments but are not limited thereto. An SSD device using a semiconductor package of a different structure that employs an internal sealing material and an external sealing material that have different modulus may also be included in the technical idea of the inventive concepts.

The memory package 3100 may be mounted on the main board 3700 through the external connection member 2400 of FIG. 1, and may include four memory packages PKG1, PKG2, PKG3, and PKG4 as shown in FIG. 1 but is not limited thereto. The memory package 3100 may include more memory packages according to a channel support state of the SSD controller 3300. Meanwhile, when the memory package 3100 is configured as a multichannel, the memory package 3100 may include memory packages less than 4.

The memory package 3100 may be mounted on the main board 3700 using a ball grid array (BGA) method through the external connection member 2400 such as a solder ball but is not limited thereto. The memory package 3100 may be mounted using a different mounting method. For example, the memory package 3100 may be mounted using, for example, a pin grid array (PGA) method, a tape carrier package (TCP) method, a chip-on-board (COB) method, a quad flat non-leaded (QFN) method, a quad flat package (QFP) method, etc.

The SSD controller 3300 may include 8 channels that are one-to-one connected to channels of the four memory packages PKG1, PKG2, PKG3, and PKG4 and control semiconductor chips included in the memory package 3100.

The SSD controller 3300 may include a program used to exchange a signal with an external device according to a serial advanced technology attachment (SATA) standard, a parallel advanced technology attachment (PATA) standard, or a small computer system interface (SCSI) standard. In this regard, the SATA standard may include all SATA-group standards such as SATA-2, SATA-3, external SATA (e-SATA), etc. in addition to SATA-1. The PATA standard may include all integrated drive electronics (IDE) group standards such as IDE, enhanced-IDE (E-IDE), etc.

The SSD controller 3300 may be responsible for EEC or FTL processing, etc. The SSD controller 3300 may be mounted on the main board 3700 in a package form. The SSD controller 3300 may be mounted on the main board 3700 using the BGA method, the PGA method, the TCP method, the COB method, the QFN method, the QFP method, etc. like the memory package 3100.

The DRAM 3500 may be or include an auxiliary memory device and may serve as a buffer that exchanges data between the SSD controller 3300 and the memory package 3100. The DRAM 3500 may also be mounted on the main board 3700 using various methods, such as the BGA method, the PGA method, the TCP method, the COB method, the QFN method, the QFP method, etc.

The main board 3700 may be or include a printed circuit board (PCB), a flexible PCB (FPCB), a ceramic substrate, a tape substrate, etc. The main board 3700 may include, for example, a core board (not shown) having an upper surface and a lower surface and resin layers (not shown) formed on the upper surface and the lower surface. The resin layers may be formed as a multilayer structure in which a signal layer, a ground layer, or a power layer that forms wire patterns is disposed. Meanwhile, separate wire patterns may be formed on the resin layers. In FIG. 12, fine patterns formed on the main board 3700 may mean wire patterns or a plurality of passive elements. Meanwhile, the interface 3900 used to communicate with an external device may be formed at one side of the main board 3700, for example, a left side.

Figure 13:
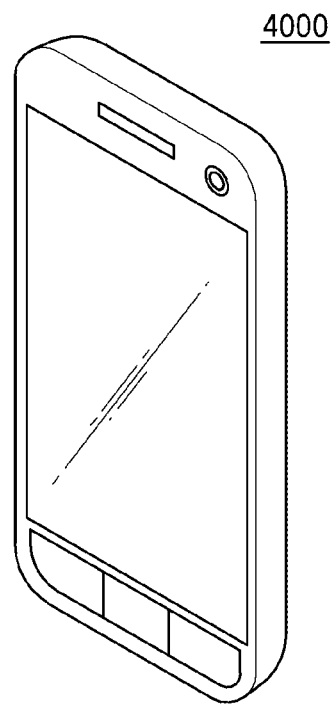
FIG. 13 is a schematic cross-sectional view of an electronic device to which a semiconductor package, according to some example embodiments, is applied.

FIG. 13 is a schematic cross-sectional view of an electronic device to which a semiconductor package according to some example embodiments is applied.

FIG. 13 shows an example in which the electronic system 2000 of FIG. 12 is applied to a mobile phone 40. In addition, the electronic system 2000 may be applied to a portable notebook, an MP3 player, a navigation system, an SSD vehicle, or a household appliance.

While the inventive concepts have been particularly shown and described with reference to example embodiments thereof, it will be understood that various changes in form and details may be made therein without departing from the spirit and scope of the following claims.

What is claimed is:

1. A semiconductor package comprising:
a substrate including a chip area and a peripheral area;
at least one semiconductor chip on the chip area;
a plurality of stubs on a plurality of pads respectively in the peripheral area; and
a molding unit configured to cover at least a partial area of the at least one semiconductor chip and at least a partial area of the plurality of stubs on the substrate, the molding unit exposing an upper surface of at least one of the plurality of stubs to an outside of the molding unit,
a first bonding wire configured to connect the at least one semiconductor chip and the plurality of pads on the substrate; and
a second bonding wire configured to connect the at least one semiconductor chip and the plurality of stubs,
wherein at least a partial area of the upper surface of at least one of the plurality of stubs is substantially flat;
wherein at least one of the plurality of stubs comprises a plurality of sub-stubs stacked in a first direction perpendicular to an upper surface of the substrate and each of the plurality of sub-stubs has a middle width greater than widths of an upper end and a lower end thereof; and
wherein one end of the second bonding wire is connected to the at least one semiconductor chip and the other end thereof is between the plurality of sub-stubs and is connected to at least one of the plurality of stubs.

2. The semiconductor package of claim 1, wherein the plurality of sub-stubs comprises a plurality of first sub-stubs on the plurality of pads and a plurality of second sub-stubs on the plurality of first sub-stubs,
wherein at least partial upper areas of the plurality of second sub-stubs are exposed to the outside of the molding unit by a plurality of concave portions located in the molding unit, and
wherein an upper surface of at least one of the plurality of second sub-stubs is substantially flat.

3. The semiconductor package of claim 2, wherein widths of the plurality of concave portions in a second direction perpendicular to the first direction are greater than widths of the plurality of stubs in the second direction.

4. The semiconductor package of claim 2, wherein depths of the plurality of concave portions in the first direction are smaller than half a depth of the molding unit in the first direction.

5. The semiconductor package of claim 1, wherein a length of at least one of the plurality of stubs in the first direction is in a range of about 1 µm to about 100 µm.

6. The semiconductor package of claim 1, wherein widths of the plurality of stubs in the second direction are in a range of about 1 µm to about 150 µm.

7. The semiconductor package of claim 1, wherein an upper surface of the molding unit is located at a higher level than a level of upper surfaces of the plurality of stubs, and
wherein the molding unit comprises a plurality of concave portions that expose an upper surface of at least one of the plurality of stubs.

8. The semiconductor package of claim 1, wherein an upper surface of the molding unit is located at a substantially same level as a level of the upper surfaces of the plurality of stubs.

9. A semiconductor package comprising:
a first package; and
a second package on the first package,
wherein the first package includes:
a first substrate;
at least one first semiconductor chip on the first substrate;
a plurality of stubs on a plurality of pads respectively on the first substrate; and
a first molding unit configured to cover at least a partial area of the at least one first semiconductor chip and at least a partial area of the plurality of stubs on the first substrate,
at least one of the plurality of stubs comprising a plurality of sub-stubs stacked in a first direction perpendicular to an upper surface of the substrate, each of the plurality of sub-stubs having a middle width greater than widths of an upper end and a lower end thereof;
at least a partial area of an upper surface of at least one of the plurality of stubs being substantially flat;
a first bonding wire configured to connect the at least one first semiconductor chip and the plurality of pads on the first substrate; and
a second bonding wire configured to connect the at least one first semiconductor chip and the plurality of stubs,
wherein one end of the second bonding wire is connected to the at least one first semiconductor chip and the other end thereof is between the plurality of sub-stubs and is connected to at least one of the plurality of stubs; and
wherein the second package includes:
a second substrate;
at least one second semiconductor chip on the second substrate;
a second molding unit configured to cover at least a partial area of the at least one second semiconductor chip on the second substrate; and
a plurality of external connection members on a lower surface of the second substrate,
wherein the plurality of external connection members are respectively connected to the plurality of stubs.

10. The semiconductor package of claim 9,
wherein an upper surface of the first molding unit is located at a higher level than a level of upper surfaces of the plurality of stubs,
wherein the first molding unit includes a plurality of concave portions that expose an upper surface of at least one of the plurality of stubs, and
wherein partial lower areas of the plurality of external connection members are located in the plurality of concave portions.

11. The semiconductor package of claim 9,
wherein an upper surface of the first molding unit, upper surfaces of the plurality of stubs, and lower surfaces of the plurality of external connection members are located at a substantially same level, and wherein the upper surfaces of the plurality of stubs and the lower surfaces of the plurality of external connection members are in contact with each other.

12. The semiconductor package of claim 9, wherein at least one of the plurality of stubs includes a plurality of sub-stubs stacked in a first direction perpendicular to an upper surface of the substrate.

13. The semiconductor package of claim 9, wherein the plurality of external connection members overlap with the plurality of stubs with respect to a plan view.

14. A semiconductor package, comprising:
   at least one semiconductor chip and a plurality of stubs on a substrate, the plurality of stubs on a plurality of pads respectively; and
   a molding unit covering the at least one semiconductor chip and the plurality of stubs, the molding unit exposing a surface of at least one of the plurality of stubs that is opposite to the substrate;
   the plurality of stubs being configured to connect the substrate to an external device; and
   at least one of the plurality of stubs comprising a plurality of sub-stubs stacked in a first direction perpendicular to an upper surface of the substrate, each of the plurality of sub-stubs having a middle width greater than widths of an upper end and a lower end thereof,
   a first bonding wire configured to connect the at least one semiconductor chip and the plurality of pads on the substrate; and
   a second bonding wire configured to connect the at least one semiconductor chip and the plurality of stubs, and
   wherein one end of the second bonding wire is connected to the at least one semiconductor chip and the other end thereof is between the plurality of sub-stubs and is connected to at least one of the plurality of stubs.

15. The semiconductor package of claim 14, wherein the external device comprises another semiconductor chip.

16. The semiconductor package of claim 14, wherein the one or more of the stubs comprise a plurality of sub-stubs stacked substantially perpendicularly to a surface of the substrate.

17. The semiconductor package of claim 14, wherein an upper surface of the molding unit is not at a lower level than upper surfaces of the exposed at least one of the plurality of stubs.

18. The semiconductor package of claim 14, wherein the surface of the at least one of the plurality of stubs is substantially flat.

* * * * *